United States Patent
Chung et al.

(10) Patent No.: US 12,512,446 B2
(45) Date of Patent: Dec. 30, 2025

(54) SEMICONDUCTOR PACKAGE

(71) Applicant: Samsung Electronics Co., Ltd., Suwon-si (KR)

(72) Inventors: Hyunsoo Chung, Hwaseong-si (KR); Younglyong Kim, Anyang-si (KR); Inhyo Hwang, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 816 days.

(21) Appl. No.: 17/834,066

(22) Filed: Jun. 7, 2022

(65) Prior Publication Data

US 2023/0069511 A1  Mar. 2, 2023

(30) Foreign Application Priority Data

Aug. 27, 2021 (KR) ......................... 10-2021-0113982

(51) Int. Cl.
*H01L 23/48* (2006.01)
*H01L 23/00* (2006.01)
(Continued)

(52) U.S. Cl.
CPC ...... *H01L 25/105* (2013.01); *H01L 23/49822* (2013.01); *H01L 23/49838* (2013.01);
(Continued)

(58) Field of Classification Search
None
See application file for complete search history.

(56) References Cited

U.S. PATENT DOCUMENTS

| | | | |
|---|---|---|---|
| 7,208,345 B2 * | 4/2007 | Meyer | H01L 24/24 257/E21.705 |
| 8,952,516 B2 | 2/2015 | Zohni et al. | |

(Continued)

FOREIGN PATENT DOCUMENTS

| | | |
|---|---|---|
| KR | 10-2013-0077031 A | 7/2013 |
| KR | 10-2017-0064217 A | 6/2017 |
| KR | 10-2020-0134377 A | 12/2020 |

OTHER PUBLICATIONS

Korean Office Action dated Aug. 1, 2025 issued in Korean Patent Application No. 10-2021-0113982.

*Primary Examiner* — Nicholas J Tobergte
(74) *Attorney, Agent, or Firm* — Harness, Dickey & Pierce, P.L.C.

(57) ABSTRACT

A semiconductor package including a package redistribution layer, a cover insulating layer on the package redistribution layer; a lower semiconductor chip arranged between the package redistribution layer and the cover insulating layer and electrically connected to the package redistribution layer, a lower molding layer surrounding the lower semiconductor chip and filling between the package redistribution layer and the cover insulating layer, a plurality of connection posts electrically connected to the package redistribution layer by passing through the cover insulating layer and the lower molding layer, an upper semiconductor chip arranged above the cover insulating layer electrically connected to the plurality of connection posts, and an upper molding layer filling between the upper semiconductor chip and the cover insulating layer and surrounding the upper semiconductor chip may be provided.

19 Claims, 15 Drawing Sheets

(51) Int. Cl.
   *H01L 23/498*       (2006.01)
   *H01L 25/10*        (2006.01)
(52) U.S. Cl.
   CPC .............. *H01L 24/16* (2013.01); *H01L 24/17*
         (2013.01); *H01L 23/49816* (2013.01); ***H01L
         24/32* (2013.01); *H01L 24/73*** (2013.01); *H01L
         2224/16235* (2013.01); *H01L 2224/1713*
         (2013.01); *H01L 2224/17179* (2013.01); *H01L
         2224/32225* (2013.01); *H01L 2224/73253*
         (2013.01); *H01L 2225/1023* (2013.01); *H01L
         2225/1041* (2013.01); *H01L 2225/1058*
         (2013.01); *H01L 2924/1431* (2013.01); *H01L
         2924/1432* (2013.01); *H01L 2924/1436*
         (2013.01); *H01L 2924/182* (2013.01)

(56) References Cited

U.S. PATENT DOCUMENTS

| | | | |
|---|---|---|---|
| 9,564,411 | B2 | 2/2017 | Park et al. |
| 9,716,066 | B2 | 7/2017 | Lee et al. |
| 9,793,198 | B2 | 10/2017 | Uzoh et al. |
| 9,859,245 | B1* | 1/2018 | Chen ................... H01L 21/6835 |
| 10,131,540 | B2 | 11/2018 | Yu et al. |
| 10,651,137 | B2 | 5/2020 | Yu et al. |
| 10,804,209 | B2 | 10/2020 | Kang |
| 11,004,827 | B2 | 5/2021 | Hsieh et al. |
| 11,296,004 | B2 | 4/2022 | Yoo et al. |
| 2006/0258044 | A1* | 11/2006 | Meyer ..................... H01L 24/82 |
| | | | 257/E21.705 |
| 2009/0127686 | A1* | 5/2009 | Yang ....................... H01L 24/19 |
| | | | 257/E23.023 |
| 2011/0233755 | A1* | 9/2011 | Kim ..................... H01L 21/6835 |
| | | | 257/693 |
| 2016/0086921 | A1* | 3/2016 | Cho ....................... H01L 24/06 |
| | | | 257/737 |
| 2017/0040290 | A1 | 2/2017 | Lin et al. |
| 2017/0154868 | A1 | 6/2017 | Jo |
| 2017/0287874 | A1* | 10/2017 | Fang ..................... H01L 24/11 |
| 2020/0098727 | A1 | 3/2020 | Mallik et al. |
| 2020/0343221 | A1 | 10/2020 | Pon et al. |

* cited by examiner

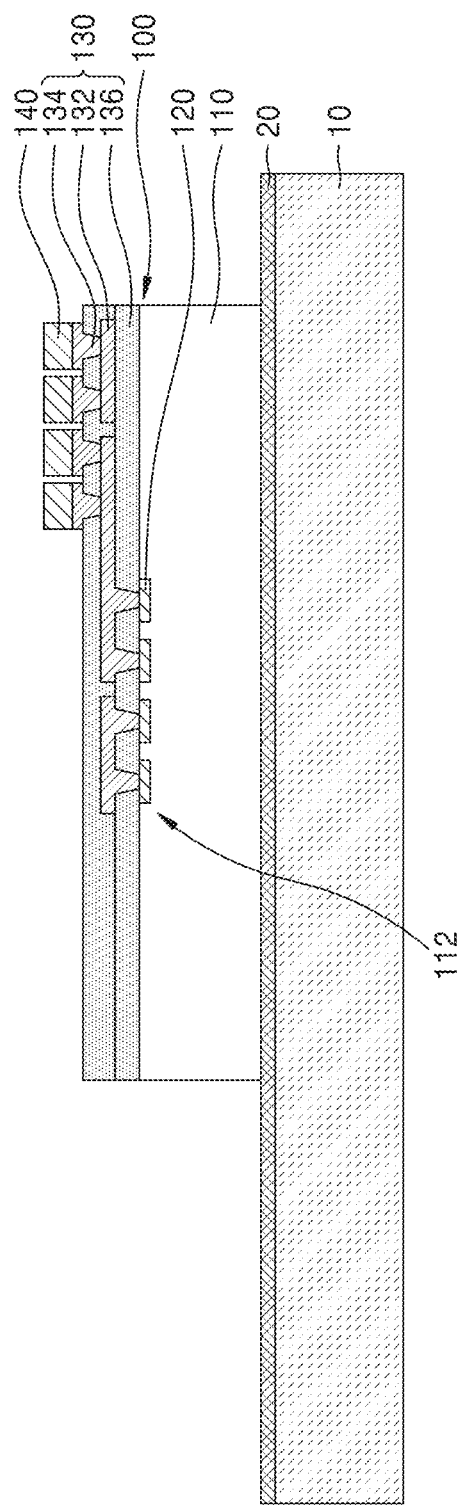

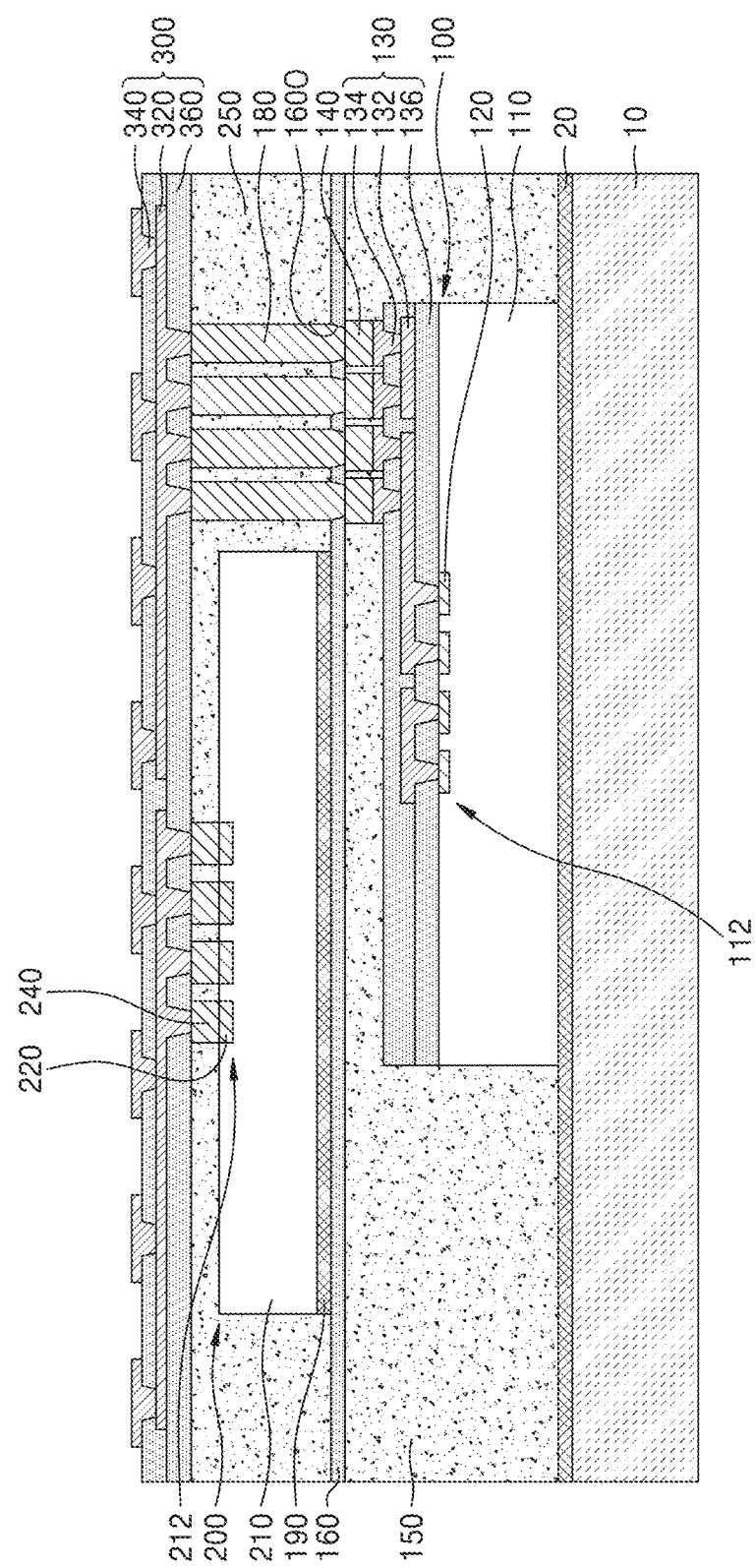

SEMICONDUCTOR PACKAGE

CROSS-REFERENCE TO RELATED APPLICATION

This application is based on and claims priority under 35 U.S.C. § 119 to Korean Patent Application No. 10-2021-0113982, filed on Aug. 27, 2021, in the Korean Intellectual Property Office, the disclosure of which is incorporated by reference herein in its entirety.

BACKGROUND

The inventive concepts relate to semiconductor packages, and more particularly, to semiconductor packages including a plurality of semiconductor chips.

Along with the rapid progress of the electronics industry and demands of users, electronic devices have been continuously miniaturized and made light, and to this end, semiconductor packages mounted in electronic products have been required to have a small volume and have a large capacity or multiple functions. Accordingly, a semiconductor package including a plurality of semiconductor chips has been developed.

SUMMARY

The inventive concepts provide semiconductor packages including a plurality of semiconductor chips.

To this end, the inventive concepts provide, for example, semiconductor packages as follows.

According to an example embodiment of the inventive concepts, a semiconductor package includes a package redistribution layer, a cover insulating layer on the package redistribution layer, a lower semiconductor chip arranged between the package redistribution layer and the cover insulating layer and electrically connected to the package redistribution layer, a lower molding layer surrounding the lower semiconductor chip and filling between the package redistribution layer and the cover insulating layer, a plurality of connection posts separated from the lower semiconductor chip in a horizontal direction and electrically connected to the package redistribution layer by passing through the cover insulating layer and the lower molding layer, an upper semiconductor chip arranged above the cover insulating layer to overlap a portion of the lower semiconductor chip and the plurality of connection posts in a vertical direction and electrically connected to the plurality of connection posts; and an upper molding layer filling between the upper semiconductor chip and the cover insulating layer and surrounding the upper semiconductor chip.

According to an example embodiment of the inventive concepts, a semiconductor package includes a package redistribution layer; a cover insulating layer on the package redistribution layer, a lower semiconductor chip arranged between the package redistribution layer and the cover insulating layer, electrically connected to the package redistribution layer via a plurality of lower connection bumps attached to a lower surface of the lower semiconductor chip, and attached to a lower surface of the cover insulating layer with the die adhesive film therebetween, the die adhesive film being attached to an upper surface of the lower semiconductor chip, a lower molding layer surrounding the lower semiconductor chip and the plurality of lower connection bumps and filling between the package redistribution layer and the cover insulating layer, a plurality of connection posts adjacent to the lower semiconductor chip, separated from the lower semiconductor chip in a horizontal direction, and electrically connected to the package redistribution layer by passing through the cover insulating layer and the lower molding layer, an upper semiconductor chip arranged above the cover insulating layer to overlap the plurality of connection posts in a vertical direction by a portion of the upper semiconductor chip that is offset with respect to the lower semiconductor chip in the horizontal direction, and the upper semiconductor chip having a same horizontal width and a horizontal area as the lower semiconductor chip, a chip redistribution layer attached to a lower surface of the upper semiconductor chip, a plurality of upper connection bumps between a lower surface of the chip redistribution layer and upper surfaces of the plurality of connection posts and electrically connecting the upper semiconductor chip to the plurality of connection posts, and an upper molding layer filling between the lower surface of the upper semiconductor chip and an upper surface of the cover insulating layer and surrounding the upper semiconductor chip and the plurality of upper connection bumps.

According to an example embodiment of the inventive concepts, a semiconductor package includes a package redistribution layer, a cover insulating layer on the package redistribution layer, a lower semiconductor chip arranged between the package redistribution layer and the cover insulating layer, electrically connected to the package redistribution layer via a plurality of lower connection bumps attached to a lower surface of the lower semiconductor chip, attached to a lower surface of the cover insulating layer with a die adhesive film therebetween, and having a first height, the die adhesive film being attached to an upper surface of the lower semiconductor chip, a lower molding layer surrounding the lower semiconductor chip and the plurality of lower connection bumps and filling between the package redistribution layer and the cover insulating layer, a plurality of connection posts adjacent to the lower semiconductor chip, separated from the lower semiconductor chip in a horizontal direction, and electrically connected to the package redistribution layer by passing through the cover insulating layer and the lower molding layer, an upper semiconductor chip arranged above the cover insulating layer to overlap the plurality of connection posts in a vertical direction by a portion of the upper semiconductor chip that is offset with respect to the lower semiconductor chip in the horizontal direction, the upper semiconductor chip having a same horizontal width and a horizontal area as the lower semiconductor chip, and having a second height that is greater than the first height, a chip redistribution layer attached to a lower surface of the upper semiconductor chip and overlapping the upper semiconductor chip in the vertical direction, a plurality of upper connection bumps between a lower surface of the chip redistribution layer and upper surfaces of the plurality of connection posts and electrically connecting the upper semiconductor chip to the plurality of connection posts, and an upper molding layer filling between the lower surface of the upper semiconductor chip and an upper surface of the cover insulating layer, surrounding the upper semiconductor chip and the plurality of upper connection bumps, and separated from the lower molding layer.

BRIEF DESCRIPTION OF THE DRAWINGS

Some example embodiments of the inventive concepts will be more clearly understood from the following detailed description taken in conjunction with the accompanying drawings in which:

FIGS. 2A to 2I are cross-sectional views sequentially illustrating a method of manufacturing a semiconductor package, according to an example embodiment of the inventive concepts;

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
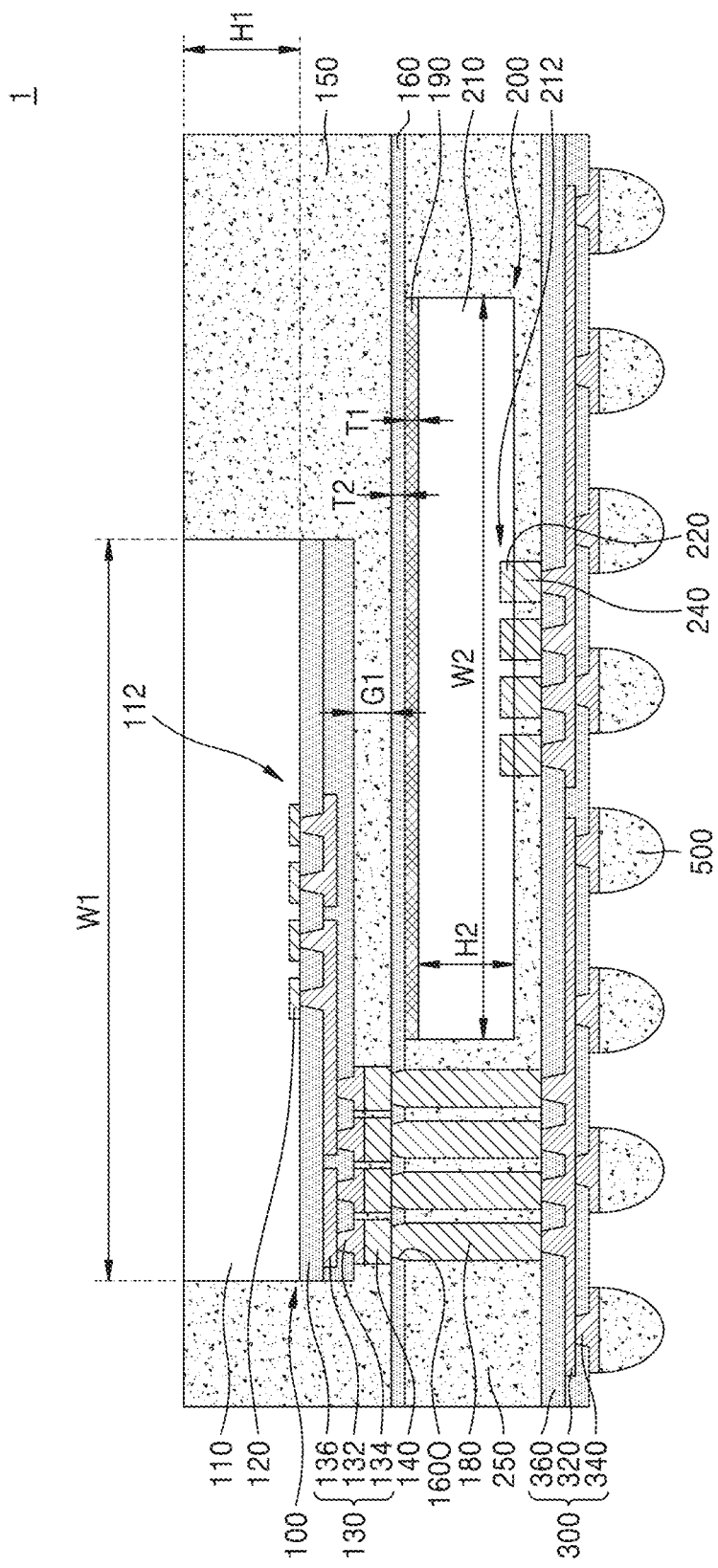
FIG. 1 is a cross-sectional view of a semiconductor package according to an example embodiment of the inventive concepts.

FIG. 1 is a cross-sectional view of a semiconductor package 1 according to an example embodiment of the inventive concepts.

Referring to FIG. 1, the semiconductor package 1 may include a package redistribution layer 300, a lower semiconductor chip 200 and a plurality of connection posts 180 attached to the package redistribution layer 300, a lower molding layer 250 surrounding the lower semiconductor chip 200 and the plurality of connection posts 180, an upper semiconductor chip 100 arranged above the lower semiconductor chip 200 and the plurality of connection posts 180 and having a lower surface to which a chip redistribution layer 130 is attached, and an upper molding layer 150 surrounding the upper semiconductor chip 100 and the chip redistribution layer 130. A cover insulating layer 160 may be between the lower molding layer 250 and the upper molding layer 150.

The package redistribution layer 300 may include a plurality of package redistribution line patterns 320, a plurality of package redistribution vias 340, and a package redistribution insulating layer 360. In some example embodiments, a plurality of package redistribution insulating layers 360 may be stacked. The package redistribution insulating layer 360 may be formed of, for example, a photo imageable dielectric (PID) or photosensitive polyimide (PSPI). The package redistribution line pattern 320 and the package redistribution via 340 may include, for example, metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru) or an alloy thereof but is not limited thereto. In some example embodiments, the package redistribution line pattern 320 and the package redistribution via 340 may be formed by stacking metal or an alloy of metal on a seed layer including, for example, Ti, a Ti nitride, or TiW.

The plurality of package redistribution line patterns 320 may be on at least one of an upper surface or a lower surface of the package redistribution insulating layer 360. The plurality of package redistribution vias 340 may be in contact with and connected to some of the plurality of package redistribution line patterns 320, respectively, by passing through the package redistribution insulating layer 360. In some example embodiments, at least some of the plurality of package redistribution line patterns 320 may be integrally formed with some of the plurality of package redistribution vias 340, respectively. For example, a package redistribution line pattern 320 may be integrated with a package redistribution via 340 in contact with an upper surface of the package redistribution line pattern 320. The package redistribution insulating layer 360 may surround the plurality of package redistribution line patterns 320 and the plurality of package redistribution vias 340.

In some example embodiments, the plurality of package redistribution vias 340 may have a tapered shape where a horizontal width thereof gradually decreases from a lower side (e.g., a bottom surface) to an upper side (e.g., a top surface) thereof. That is, the plurality of package redistribution vias 340 may have a horizontal width gradually increasing away from the lower semiconductor chip 200.

Package redistribution line patterns 320 on a lower surface of the package redistribution layer 300 among the plurality of package redistribution line patterns 320 may be referred as package lower surface pads.

A plurality of package connection terminals 500 may be respectively attached to the package lower surface pads among the plurality of package redistribution line patterns 320. For example, the package connection terminal 500 may be a solder ball or a bump.

A horizontal width and a horizontal area of the package redistribution layer 300 may be the same as those of the semiconductor package 1, respectively. For example, horizontal widths and horizontal areas of the package redistribution layer 300, the lower molding layer 250, the upper molding layer 150, and the cover insulating layer 160 may be the same as or substantially similar to each other, respectively. The package redistribution layer 300, the lower molding layer 250, the upper molding layer 150, and the cover insulating layer 160 may overlap each other in a vertical direction.

The lower semiconductor chip 200 may include a lower semiconductor substrate 210 having an active surface and an inactive surface opposite to each other, a lower semiconductor device 212 on the active surface of the lower semiconductor substrate 210, and a plurality of lower chip pads 220 on a lower surface of the lower semiconductor chip 200. The inactive surface of the lower semiconductor substrate 210 may be an upper surface of the lower semiconductor chip 200, and a lower back end of line (BEOL) layer (although not separately illustrated in FIG. 1) including wiring lines, wiring vias, and an inter-wiring insulating layer surrounding the wiring lines and the wiring vias may be between the active surface of the lower semiconductor substrate 210 and the lower surface of the lower semiconductor chip 200.

The wiring lines and the wiring vias may include, for example, a metal material such as Al, Cu, or W. In some example embodiments, each wiring line may include a wiring barrier layer and a wiring metal layer. The wiring barrier layer may include nitride or oxide of metal (e.g., Ti, Ta, Ru, Mn, Co, or W) or include an alloy (e.g., a cobalt tungsten phosphide (CoWP), a cobalt tungsten boron (CoWB), or a cobalt tungsten boron phosphide (CoWBP)). The wiring metal layer may include at least one metal selected from among W, Al, Ti, Ta, Ru, Mn, and Cu. The inter-wiring insulating layer may include, for example, a silicon (Si) oxide. In some example embodiments, the inter-wiring insulating layer may include a tetraethyl orthosilicate (TEOS). In some other embodiments, the inter-wiring insulating layer may include an insulating material having a lower dielectric constant than the Si oxide. For example, the inter-wiring insulating layer may include an ultra-low k (ULK) layer having an ultra-low dielectric constant K of about 2.2 to about 2.4. The ULK layer may include a silicon oxycarbide (SiOC) layer or a silicon hydroxyl carbon (SiCOH) layer.

In some example embodiments, the plurality of lower chip pads 220 may be center pads around the center of the lower surface of the lower semiconductor chip 200. The lower semiconductor chip 200 may have a face-down arrangement in which the active surface of the lower semiconductor substrate 210 faces downward. The lower semiconductor chip 200 may be attached to the package redistribution layer 300 so that the active surface of the lower semiconductor substrate 210 faces the package redistribution layer 300.

The lower semiconductor substrate 210 may include, for example, a semiconductor material such as Si or germanium (Ge). In some example embodiments, the lower semiconductor substrate 210 may include a compound semiconductor material such as a silicon carbide (SiC), a gallium arsenide (GaAs), an indium arsenide (InAs), or an indium phosphide (InP). The lower semiconductor substrate 210 may include a conductive region, e.g., an impurity-doped well. The lower semiconductor substrate 210 may have various device isolation structures such as a shallow trench isolation (STI) structure.

On the active surface of the lower semiconductor substrate 210, the lower semiconductor device 212 including various types of a plurality of individual devices may be formed. The plurality of individual devices may include various microelectronic devices, e.g., a metal-oxide-semiconductor field effect transistor (MOSFET) such as a complementary metal-oxide-semiconductor (CMOS) transistor, a system large scale integration (LSI) device, an active device, a passive device, and the like. The plurality of individual devices may be electrically connected to the conductive region of the lower semiconductor substrate 210. The lower semiconductor device 212 may further include a conductive wiring or a conductive plug electrically connecting at least two of the plurality of individual devices or the plurality of individual devices to the conductive region of the lower semiconductor substrate 210. Further, each of the plurality of individual devices may be electrically isolated from neighboring other individual devices by an insulating layer.

In some example embodiments, the lower semiconductor device 212 may be a memory semiconductor device, and the lower semiconductor chip 200 may be a memory semiconductor chip. For example, the lower semiconductor device 212 may be a dynamic random access memory (DRAM) device, and the lower semiconductor chip 200 may be a DRAM chip.

The lower semiconductor chip 200 may be electrically connected to the package redistribution layer 300 via a plurality of lower connection bumps 240 attached to the plurality of lower chip pads 220. Electrically connected to the package redistribution layer 300 indicates electrically connected to a conductive member included in the package redistribution layer 300 (e.g., at least a portion of the plurality of package redistribution line patterns 320 and the plurality of package redistribution vias 340). Each of the plurality of lower connection bumps 240 may be in contact with and electrically connected to any one of the plurality of package redistribution vias 340 and the plurality of package redistribution line patterns 320. In some example embodiments, each of the plurality of lower connection bumps 240 may be in contact with and electrically connected to a package redistribution via 340 on an upper surface of the package redistribution layer 300 among the plurality of package redistribution vias 340 but example embodiments are not limited thereto. In some other example embodiments, some of the plurality of package redistribution line patterns 320 may be on the upper surface of the package redistribution layer 300, and each of the plurality of lower connection bumps 240 may be in contact with and electrically connected to a package redistribution line pattern 320 on the upper surface of the package redistribution layer 300 among the plurality of package redistribution line patterns 320. Each of the plurality of lower connection bumps 240 may have a height of, for example, about 15 µm to about 40 µm.

A die adhesive film 190 may be attached to the upper surface (e.g., an inactive surface) of the lower semiconductor chip 200. The die adhesive film 190 may completely cover the upper surface of the lower semiconductor chip 200. The die adhesive film 190 may be between the lower semiconductor chip 200 and the cover insulating layer 160. The lower semiconductor chip 200 may be attached to the cover insulating layer 160 by the die adhesive film 190 attached to the inactive surface of the lower semiconductor chip 200. The die adhesive film 190 may have a first thickness T1. The first thickness T1 may be, for example, about 5 µm to about 20 µm.

The lower molding layer 250 may surround the lower semiconductor chip 200, the die adhesive film 190, and the plurality of connection posts 180. The lower molding layer 250 may cover side surfaces and the lower surface of the lower semiconductor chip 200. The lower molding layer 250 may surround the plurality of lower connection bumps 240 and fill between the lower surface of the lower semiconductor chip 200 and the upper surface of the package redistribution layer 300. The lower molding layer 250 may include, for example, an epoxy mold compound (EMC).

The cover insulating layer 160 may be on the lower molding layer 250. The cover insulating layer 160 may cover an upper surface of the lower molding layer 250 and an upper surface of the die adhesive film 190. The cover insulating layer 160 may have a plurality of connection holes 1600. The plurality of connection holes 1600 may pass through the cover insulating layer 160. In some example embodiments, the plurality of connection holes 1600 may have a tapered shape where a horizontal width thereof gradually decreases from a lower side (e.g., a bottom) to an upper side (e.g., a top) thereof. That is, the plurality of connection holes 1600 may have a horizontal width gradually decreasing away from the lower semiconductor chip 200 and gradually increasing away from the upper semiconductor chip 100. The cover insulating layer 160 may include a polymer. For example, the cover insulating layer 160 may be formed of a PID or PSPI. The cover insulating layer 160 may have a second thickness T2. For example, the second thickness T2 may be, for example, about 5 μm to about 20 μm.

The plurality of connection posts 180 may be attached to the package redistribution layer 300 at an area adjacent to the lower semiconductor chip 200 and separated from the lower semiconductor chip 200 in a horizontal direction. The plurality of connection posts 180 may pass through the lower molding layer 250 and the cover insulating layer 160. The plurality of connection posts 180 may fill the plurality of connection holes 1600 of the cover insulating layer 160.

In some example embodiments, each of the plurality of connection posts 180 may have a cylindrical shape or a square pillar shape. In some other example embodiments, in each of the plurality of connection posts 180, a portion may have a cylindrical shape, and the other portion may have a square pillar shape. For example, in each of the plurality of connection posts 180, a portion filling each of the plurality of connection holes 1600 may have a square pillar shape, and the other portion may have a cylindrical shape. In some example embodiments, in each of the plurality of connection posts 180, a portion filling each of the plurality of connection holes 1600 may have a cylindrical shape, and the other portion may have a square pillar shape. A height of each of the plurality of connection posts 180 may be the same as or substantially similar to a sum of the height of the lower connection bump 240, a second height H2 that is a height of the lower semiconductor chip 200, the first thickness T1 that is the thickness of the die adhesive film 190, and the second thickness T2 that is the thickness of the cover insulating layer 160. For example, the height of each of the plurality of connection posts 180 may be about 75 μm to about 280 μm.

In some example embodiments, the plurality of connection posts 180 may be arranged along only one edge among four edges of the lower semiconductor chip 200 while being separated from the lower semiconductor chip 200 in a top view. In some other example embodiments, the plurality of connection posts 180 may be arranged along only two neighboring edges among the four edges of the lower semiconductor chip 200 while being separated from the lower semiconductor chip 200 in a top view. The portions of the plurality of connection posts 180, which pass through the cover insulating layer 160 (e.g., the portions filling the plurality of connection holes 1600 of the cover insulating layer 160), may have a tapered shape where a horizontal width thereof gradually decreases from a lower side (e.g., a bottom) to an upper side (e.g., a top) thereof. In some example embodiments, an upper surface of each of the plurality of connection posts 180 may have the least horizontal width.

Each of the plurality of connection posts 180 may be in contact with and electrically connected to any one of the plurality of package redistribution vias 340 and the plurality of package redistribution line patterns 320. Any one of the plurality of lower connection bumps 240 and the plurality of connection posts 180 may be in contact with and electrically connected to each of package redistribution vias 340 or package redistribution line patterns 320 on the upper surface of the package redistribution layer 300 among the plurality of package redistribution vias 340 and the plurality of package redistribution line patterns 320.

The upper surfaces of the plurality of connection posts 180 may be coplanar with an upper surface of the cover insulating layer 160. Lower surfaces of the plurality of connection posts 180, lower surfaces of the plurality of lower connection bumps 240, and a lower surface of the lower molding layer 250 may be coplanar with each other.

The upper semiconductor chip 100 may be above the cover insulating layer 160. The chip redistribution layer 130 may be attached to the lower surface of the upper semiconductor chip 100. The upper semiconductor chip 100 to which the chip redistribution layer 130 is attached may be separated from the cover insulating layer 160 in the vertical direction. That is, the chip redistribution layer 130 may be separated from the cover insulating layer 160 in the vertical direction.

The upper semiconductor chip 100 may include an upper semiconductor substrate 110 having an active surface and an inactive surface opposite to each other, an upper semiconductor device 112 formed on the active surface of the upper semiconductor substrate 110, and a plurality of upper chip pads 120 on the lower surface of the upper semiconductor chip 100. The inactive surface of the upper semiconductor substrate 110 may be an upper surface of the upper semiconductor chip 100. Although not specifically illustrated in FIG. 1, an upper BEOL layer including wiring lines, wiring vias, and an inter-wiring insulating layer surrounding the wiring lines and the wiring vias may be between the active surface of the upper semiconductor substrate 110 and the lower surface of the upper semiconductor chip 100.

The upper semiconductor chip 100 may be electrically connected to the chip redistribution layer 130 via the plurality of upper chip pads 120. Electrically connected to the chip redistribution layer 130 indicates electrically connected to a conductive member included in the chip redistribution layer 130 (e.g., at least a portion of a plurality of chip redistribution line patterns 132 and a plurality of chip redistribution vias 134). In some example embodiments, the plurality of upper chip pads 120 may be center pads around the center of the lower surface of the upper semiconductor chip 100. The upper semiconductor chip 100 may have a face-down arrangement in which the active surface of the upper semiconductor substrate 110 faces downward. The upper semiconductor chip 100 may be attached to the chip redistribution layer 130 so that the active surface of the upper semiconductor substrate 110 faces the chip redistribution layer 130.

The upper semiconductor chip 100 may have a first height H1 and a first horizontal width W1, and the lower semiconductor chip 200 may have the second height H2 and a second horizontal width W2. In some example embodiments, the first height H1 may be greater than the second height H2. For example, the first height H1 may be greater than the second height H2 by about 50 μm to about 150 μm. In some example embodiments, the first height H1 may be about 150 μm to about 300 μm, and the second height H2 may be less than the first height H1 and about 50 μm to about 200 μm. In some example embodiments, the first horizontal width W1 may be the same as or substantially similar to the second horizontal width W2. Because the first height H1 of the upper semiconductor chip 100 is greater than the second height H2 of the lower semiconductor chip 200, heat generated inside the semiconductor package 1 (e.g., heat generated in the lower semiconductor chip 200 and/or the upper semiconductor chip 100) may be discharged to the outside through the upper surface of the upper semiconductor chip 100. For example, the upper surface (e.g., an inactive surface) of the upper semiconductor chip 100 may be exposed to the outside.

Except that the upper semiconductor chip 100 has the first height H1 and the lower semiconductor chip 200 has the second height H2 that is less than the first height H1, the upper semiconductor chip 100 and the lower semiconductor chip 200 may be the same or substantially type of semiconductor chips. For example, the lower semiconductor chip 200 may be formed by removing a portion of the upper semiconductor substrate 110 that is adjacent to the inactive surface of the upper semiconductor chip 100. The upper semiconductor chip 100 and the lower semiconductor chip 200 may have the same horizontal width and horizontal area.

Except that the upper semiconductor chip 100 has the first height H1 and the lower semiconductor chip 200 has the second height H2 that is less than the first height H1, the upper semiconductor chip 100, the upper semiconductor substrate 110, the upper semiconductor device 112, the plurality of upper chip pads 120, and the upper BEOL layer are the same as or substantially similar to the lower semiconductor chip 200, the lower semiconductor substrate 210, the lower semiconductor device 212, the plurality of lower chip pads 220, and the lower BEOL layer, respectively, and thus, a repetitive description thereof may be omitted herein. For example, the upper semiconductor device 112 may be a DRAM device, and the upper semiconductor chip 100 may be a DRAM chip.

The chip redistribution layer 130 may include the plurality of chip redistribution line patterns 132, the plurality of chip redistribution vias 134, and a chip redistribution insulating layer 136. In some example embodiments, a plurality of chip redistribution insulating layers 136 may be stacked. The plurality of chip redistribution line patterns 132, the plurality of chip redistribution vias 134, and the chip redistribution insulating layer 136 included in the chip redistribution layer 130 are the same as or substantially similar to the plurality of package redistribution line patterns 320, the plurality of package redistribution vias 340, and the package redistribution insulating layer 360 included in the package redistribution layer 300, respectively, and thus, a repetitive description thereof may be omitted herein.

The plurality of chip redistribution line patterns 132 may be on at least one of upper and lower surfaces of the chip redistribution insulating layer 136. The plurality of chip redistribution vias 134 may be in contact with and connected to some of the plurality of chip redistribution line patterns 132, respectively, by passing through the chip redistribution insulating layer 136. In some example embodiments, at least some of the plurality of chip redistribution line patterns 132 may be integrally formed with some of the plurality of chip redistribution vias 134, respectively. For example, a chip redistribution line pattern 132 may be integrated with a chip redistribution via 134 in contact with an upper surface of the chip redistribution line pattern 132. The chip redistribution insulating layer 136 may surround the plurality of chip redistribution line patterns 132 and the plurality of chip redistribution vias 134.

In some example embodiments, the plurality of chip redistribution vias 134 may have a tapered shape where a horizontal width thereof gradually decreases from a lower side (e.g., a bottom surface) to an upper side (e.g., a top surface) thereof. That is, the plurality of chip redistribution vias 134 may have a horizontal width gradually increasing away from the upper semiconductor chip 100. Chip redistribution line patterns 132 on a lower surface of the chip redistribution layer 130 among the plurality of chip redistribution line patterns 132 may be referred as chip lower surface pads. In some example embodiments, the chip lower surface pads among the plurality of chip redistribution line patterns 132 may be edge pads around an edge of the lower surface of the upper semiconductor chip 100.

A plurality of upper connection bumps 140 may be attached to the chip lower surface pads (e.g., some chip redistribution line patterns the plurality of chip redistribution line patterns 132). For example, the upper connection bump 140 may be a solder ball or a bump. Each of the upper connection bump 140 may have a height of, for example, about 15 μm to about 40 μm.

In some example embodiments, each of the plurality of upper chip pads 120 may be in contact with and electrically connected to a chip redistribution via 134 on an upper surface of the chip redistribution layer 130 among the plurality of chip redistribution vias 134 but example embodiments are not limited thereto. In some other example embodiments, some of the plurality of chip redistribution line patterns 132 may be on the upper surface of the chip redistribution layer 130, and each of the plurality of upper connection bumps 140 may be in contact with and electrically connected to a chip redistribution line pattern 132 on the upper surface of the chip redistribution layer 130 among the plurality of chip redistribution line patterns 132.

A horizontal width and a horizontal area of the chip redistribution layer 130 may be the same as those of the upper semiconductor chip 100, respectively. The chip redistribution layer 130 and the upper semiconductor chip 100 may overlap each other in the vertical direction. Therefore, the horizontal width and the horizontal area of the chip redistribution layer 130 may be less than those of the package redistribution layer 300, respectively.

The chip lower surface pads (e.g., some chip redistribution line patterns among the plurality of chip redistribution line patterns 132) and the plurality of upper connection bumps 140 may not overlap the lower semiconductor chip 200 in the vertical direction. In some example embodiments, the chip lower surface pads and the plurality of upper connection bumps 140 may be within the chip redistribution layer 130 and the upper semiconductor chip 100 along only one edge among four edges of the upper semiconductor chip 100 in a top view. In some other example embodiments, the chip lower surface pads and the plurality of upper connection bumps 140 may be within the chip redistribution layer 130 and the upper semiconductor chip 100 along only two neighboring edges among the four edges of the upper semiconductor chip 100 in a top view.

The plurality of upper connection bumps 140 may be in contact with and electrically connected to the plurality of connection posts 180. The upper semiconductor chip 100 may be electrically connected to the package redistribution layer 300 via the plurality of upper chip pads 120, the plurality of chip redistribution line patterns 132 and the plurality of chip redistribution vias 134 included in the chip redistribution layer 130, the plurality of upper connection bumps 140, and the plurality of connection posts 180.

The upper molding layer 150 surrounding the upper semiconductor chip 100 and the chip redistribution layer 130 may be on the cover insulating layer 160. The upper molding layer 150 may be separated from the lower molding layer 250 in the vertical direction with the cover insulating layer 160 therebetween. The upper molding layer 150 may cover side surfaces of the upper semiconductor chip 100, the upper surface of the chip redistribution layer 130, and the lower surface of the chip redistribution layer 130. The upper molding layer 150 may surround the plurality of upper connection bumps 140 and fill between the lower surface of the chip redistribution layer 130 and the upper surface of the cover insulating layer 160. In some example embodiments, the upper molding layer 150 may not cover the upper surface (e.g., the inactive surface) of the upper semiconductor chip 100. The upper molding layer 150 may include, for example, an EMC.

Lower surfaces of the plurality of upper connection bumps 140 may be coplanar with a lower surface of the upper molding layer 150. The upper surface of the upper semiconductor chip 100 may be coplanar with the upper surface of the upper molding layer 150.

The plurality of upper connection bumps 140 may not be arranged at a portion where the upper semiconductor chip 100 and the lower semiconductor chip 200 overlap in the vertical direction. That is, the plurality of upper connection bumps 140 may be arranged to overlap a portion of the upper semiconductor chip 100 that does not overlap the lower semiconductor chip 200 in the vertical direction.

At the portion where the upper semiconductor chip 100 and the lower semiconductor chip 200 overlap in the vertical direction, only a portion of the upper molding layer 150 may be between the cover insulating layer 160 and the chip redistribution layer 130. That is, at the portion where the upper semiconductor chip 100 and the lower semiconductor chip 200 overlap in the vertical direction, the chip redistribution layer 130, the upper molding layer 150, the cover insulating layer 160, and the die adhesive film 190 may be interposed, and the plurality of upper connection bumps 140 may not be interposed. The cover insulating layer 160 and the chip redistribution layer 130 may be separated with a first gap G1 in the vertical direction. The first gap G1 may be greater than the height of the upper connection bump 140. The first gap G1 may be about 20 μm to about 50 μm.

Side walls of the upper molding layer 150, the cover insulating layer 160, the lower molding layer 250, and the package redistribution layer 300 may be aligned in the vertical direction. Corresponding side walls of the upper molding layer 150, the cover insulating layer 160, the lower molding layer 250, and the package redistribution layer 300 may be coplanar with each other.

The upper semiconductor chip 100 and the lower semiconductor chip 200 may be electrically connected to each other or electrically connected to the plurality of package connection terminals 500, via the plurality of package redistribution line patterns 320 and the plurality of package redistribution vias 340 included in the package redistribution layer 300.

In the semiconductor package 1 according to the example embodiment of the inventive concepts, a portion of the upper semiconductor chip 100 and a portion of lower semiconductor chip 200 overlap in the vertical direction, and the upper semiconductor chip 100 and the package redistribution layer 300 may be electrically connected via the plurality of upper connection bumps 140 and the plurality of connection posts 180 arranged at the other portion of the upper semiconductor chip 100 that does not overlap the lower semiconductor chip 200 in the vertical direction. Therefore, an electrical connection between the upper semiconductor chip 100 and the package redistribution layer 300 and an electrical connection between the lower semiconductor chip 200 and the package redistribution layer 300 may be relatively simply configured while minimizing the horizontal width and the horizontal area of the semiconductor package 1, thereby forming the semiconductor package 1 at a low cost.

Further, referring to FIGS. 2A to 2I, the upper semiconductor chip 100 and the upper molding layer 150 are formed first, then the cover insulating layer 160 is formed, and the lower semiconductor chip 200 is attached to the cover insulating layer 160. Therefore, the portion of the upper semiconductor chip 100, which overlaps the lower semiconductor chip 200 in the vertical direction in the semiconductor package 1 and is overhung above the lower semiconductor chip 200, may be fixed by the upper molding layer 150 so that structural deformation such as bending does not occur, thereby improving the structural reliability of the semiconductor package 1.

FIGS. 2A to 2I are cross-sectional views sequentially illustrating a method of manufacturing a semiconductor package, according to an example embodiment of the inventive concepts.

Referring to FIG. 2A, the upper semiconductor chip 100 is formed by forming the upper semiconductor device 112 on the active surface of the upper semiconductor substrate 110 having the active surface and the inactive surface opposite to each other, and arranging the plurality of upper chip pads 120 on the active surface of the upper semiconductor substrate 110. The plurality of upper chip pads 120 may be formed as center pads around the center of the upper surface of the upper semiconductor chip 100.

The chip redistribution layer 130 including the plurality of chip redistribution line patterns 132, the plurality of chip redistribution vias 134, and the chip redistribution insulating layer 136 is formed on the upper surface of the upper semiconductor chip 100. In some example embodiments, the chip redistribution layer 130 may include a plurality of chip redistribution insulating layers 136 stacked. For example, the chip redistribution layer 130 may be formed by forming the chip redistribution insulating layer 136 and then repeating a process of forming a chip redistribution via 134, passing through the chip redistribution insulating layer 136, and forming a chip redistribution line pattern 132 on the upper surface of the chip redistribution insulating layer 136 to be integrated with the chip redistribution via 134. The plurality of chip redistribution vias 134 may have a tapered shape where a horizontal width thereof gradually increases from a lower side (e.g., a bottom surface) to an upper side (e.g., an upper surface) thereof.

In some example embodiments, chip redistribution vias 134 on the lower surface of the chip redistribution layer 130 among the plurality of chip redistribution vias 134 may be in contact with and electrically connected to the plurality of upper chip pads 120, respectively. In some other example embodiments, the plurality of chip redistribution line patterns 132 may be formed so that some of the plurality of chip redistribution line patterns 132 are on the upper surface of the chip redistribution layer 130, and the chip redistribution line patterns 132 on the upper surface of the chip redistribution layer 130 among the plurality of chip redistribution line patterns 132 may be in contact with and electrically connected to the plurality of upper connection bumps 140, respectively.

The plurality of upper connection bumps 140 may be formed on chip redistribution line patterns 132 on the upper surface of the chip redistribution layer 130 among the plurality of chip redistribution line patterns 132. In some example embodiments, the plurality of upper connection bumps 140 may be formed within the chip redistribution layer 130 and the upper semiconductor chip 100 along only one edge among the four edges of the upper semiconductor chip 100 in a top view. In some other example embodiments, the plurality of upper connection bumps 140 may be formed within the chip redistribution layer 130 and the upper semiconductor chip 100 along only two neighboring edges among the four edges of the upper semiconductor chip 100 in a top view.

After forming the chip redistribution layer 130 on the upper surface of the upper semiconductor chip 100, the upper semiconductor chip 100 is attached to a support substrate 10. For example, after attaching a release film 20 to an upper surface of the support substrate 10, the upper semiconductor chip 100 may be attached to the release film 20. The release film 20 may be between the lower surface of the upper semiconductor chip 100, (e.g., the inactive surface of the upper semiconductor substrate 110) and the upper surface of the support substrate 10. In some example embodiments, the release film 20 may completely cover the upper surface of the support substrate 10.

Figure 2B:
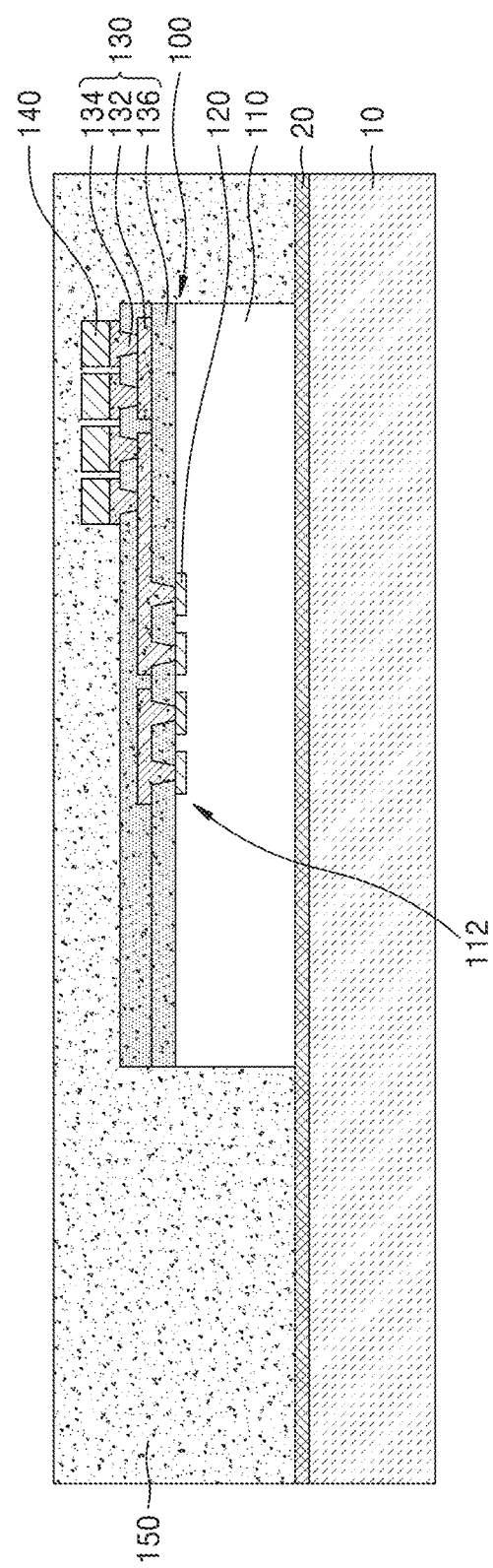

Referring to FIG. 2B, the upper molding layer 150 surrounding the upper semiconductor chip 100 and the chip redistribution layer 130 is formed on the support substrate 10 to which the release film 20 is attached. In some example embodiments, the upper molding layer 150 may be formed with a sufficient thickness to cover upper surfaces of the plurality of upper connection bumps 140.

Figure 2C:
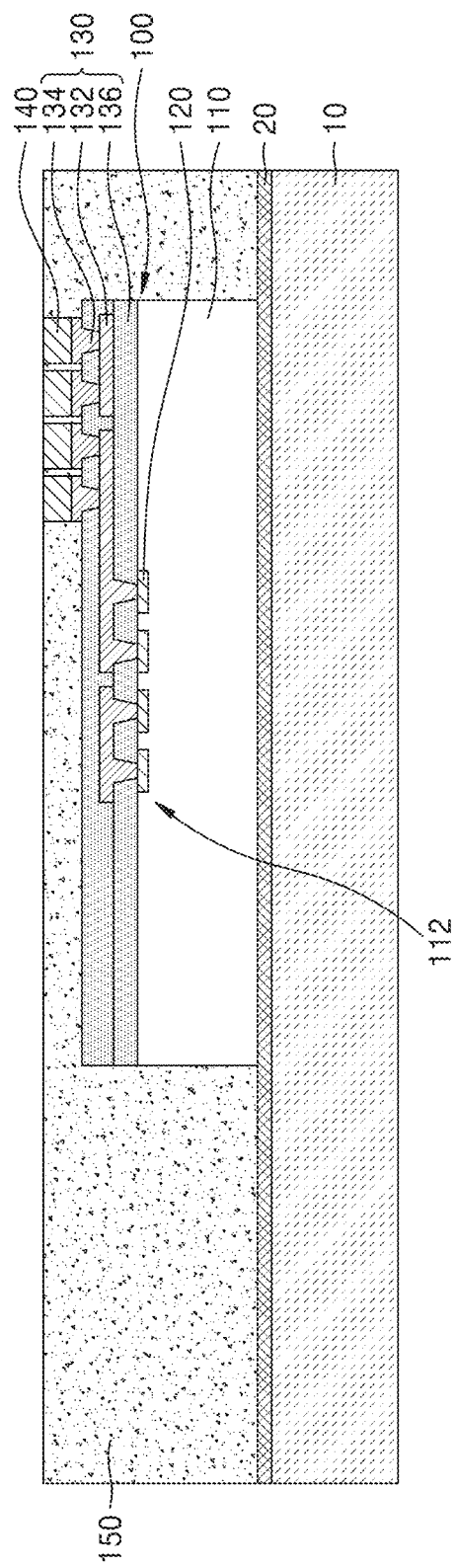

Referring to FIGS. 2B and 2C, the upper surfaces of the plurality of upper connection bumps 140 are exposed by removing an upper portion of the upper molding layer 150 shown in FIG. 2C. For example, the upper portion of the upper molding layer 150 may be removed by performing a grinding process so that the upper surfaces of the plurality of upper connection bumps 140 are exposed. The upper surfaces of the plurality of upper connection bumps 140 may be coplanar with an upper surface of the upper molding layer 150 of which the upper portion has been removed.

In some other example embodiments, the upper molding layer 150 may be formed not to cover the upper surfaces of the plurality of upper connection bumps 140 so that a process of removing the upper portion of the upper molding layer 150 shown in FIGS. 2B and 2C is omitted.

Figure 2D:
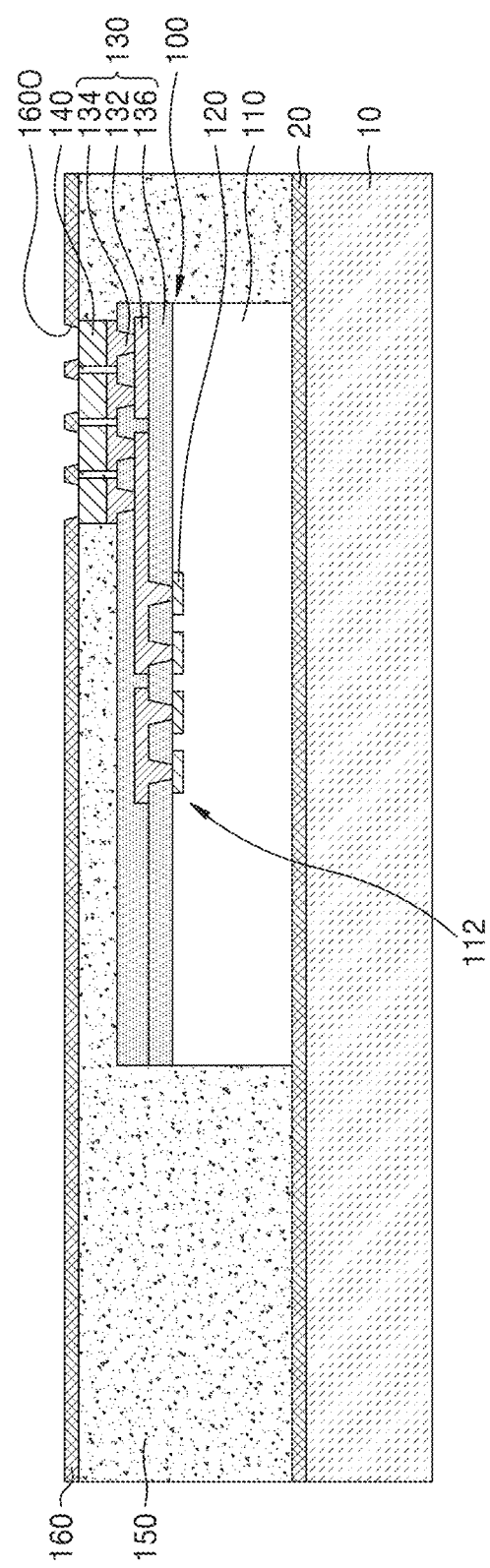

Referring to FIG. 2D, the cover insulating layer 160 having the plurality of connection holes 1600 is formed on the upper molding layer 150. At least a portion of the upper surfaces of the plurality of upper connection bumps 140 may be exposed in the plurality of connection holes 1600. The cover insulating layer 160 may cover the upper molding layer 150 so that the upper molding layer 150 is not exposed. For example, the upper molding layer 150 may not be exposed in the plurality of connection holes 1600.

The cover insulating layer 160 may be formed of a polymer. For example, the cover insulating layer 160 having the plurality of connection holes 1600 may be formed by forming a preliminary cover insulating layer formed of a PID or PSPI and then removing a portion of the preliminary cover insulating layer to expose the upper surfaces of the plurality of upper connection bumps 140. In some example embodiments, the plurality of connection holes 1600 may have a tapered shape where a horizontal width thereof gradually decreases from an upper side (e.g., a top) to a lower side (e.g., a bottom) thereof.

Figure 2E:
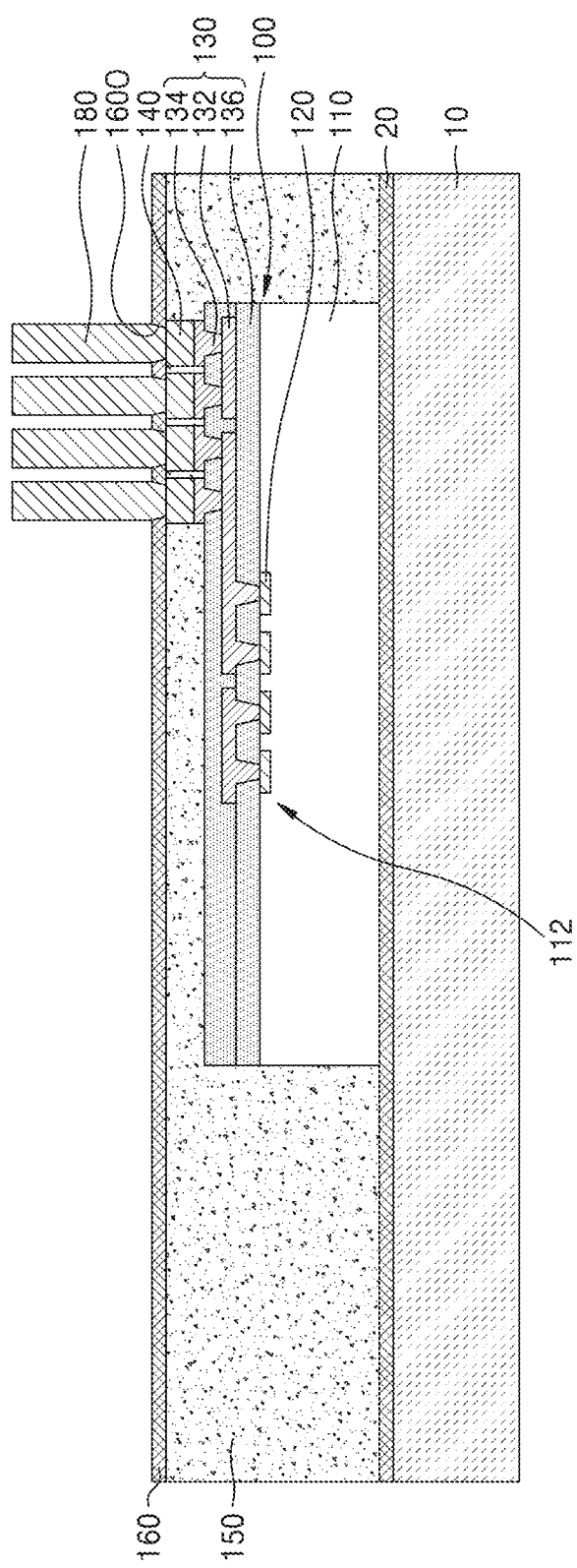

Referring to FIG. 2E, the plurality of connection posts 180 are respectively formed on the plurality of upper connection bumps 140. In some example embodiments, the plurality of connection posts 180 may be formed by performing a plating process in which the plurality of upper connection bumps 140 are used as a seed. For example, the plurality of connection posts 180 may be formed by performing an electroplating process or an electroless plating process.

In some other example embodiments, the plurality of connection posts 180 may be formed by forming a separate seed layer on the plurality of upper connection bumps 140 and the cover insulating layer 160, forming a mask layer which exposes a portion of the seed layer covering the plurality of upper connection bumps 140 and covers the other portion of the seed layer, then performing a plating process in which the seed layer is used as a seed, and performing a lift process to remove the mask layer.

Figure 2F:
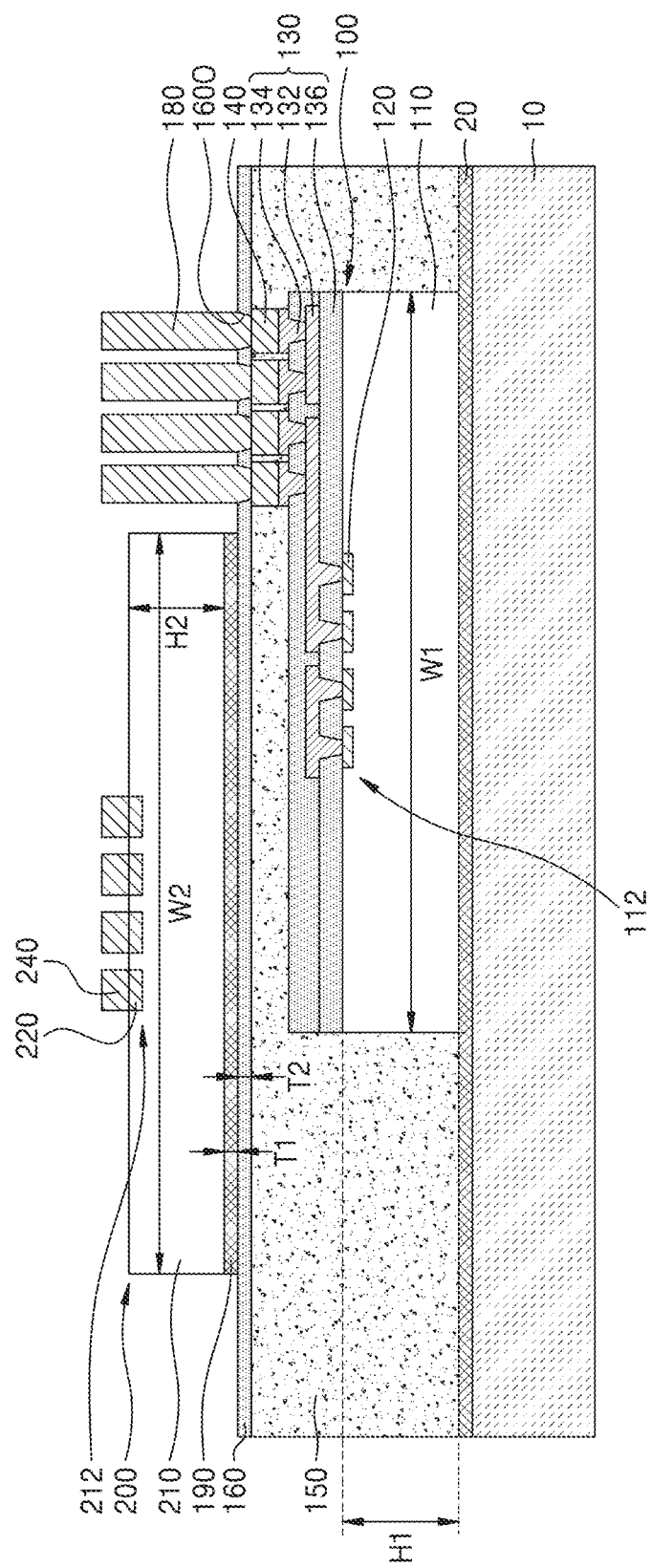

Referring to FIG. 2F, the lower semiconductor chip 200 is formed by forming the lower semiconductor device 212 on the active surface of the lower semiconductor substrate 210 having the active and inactive surfaces opposite to each other and arranging the plurality of lower chip pads 220 on the active surface of the lower semiconductor substrate 210. The plurality of lower chip pads 220 may be formed as center pads around the center of the upper surface of the lower semiconductor chip 200. The plurality of lower connection bumps 240 may be respectively formed on the plurality of lower chip pads 220.

The die adhesive film 190 is attached to the lower surface (e.g., the inactive surface) of the lower semiconductor chip 200, and then, the lower semiconductor chip 200 is attached to the cover insulating layer 160 by using the die adhesive film 190. The lower semiconductor chip 200 may be attached to the cover insulating layer 160 and separated from the plurality of connection posts 180 in the horizontal direction.

The upper surfaces of the plurality of connection posts 180 may be located at a higher vertical level than the upper surface of the lower semiconductor chip 200. In some example embodiments, the upper surfaces of the plurality of connection posts 180 and upper surfaces of the plurality of lower connection bumps 240 may be located at the same vertical level. In some other example embodiments, the upper surfaces of the plurality of connection posts 180 may be located at a slightly higher vertical level than the upper surfaces of the plurality of lower connection bumps 240.

Figure 2G:
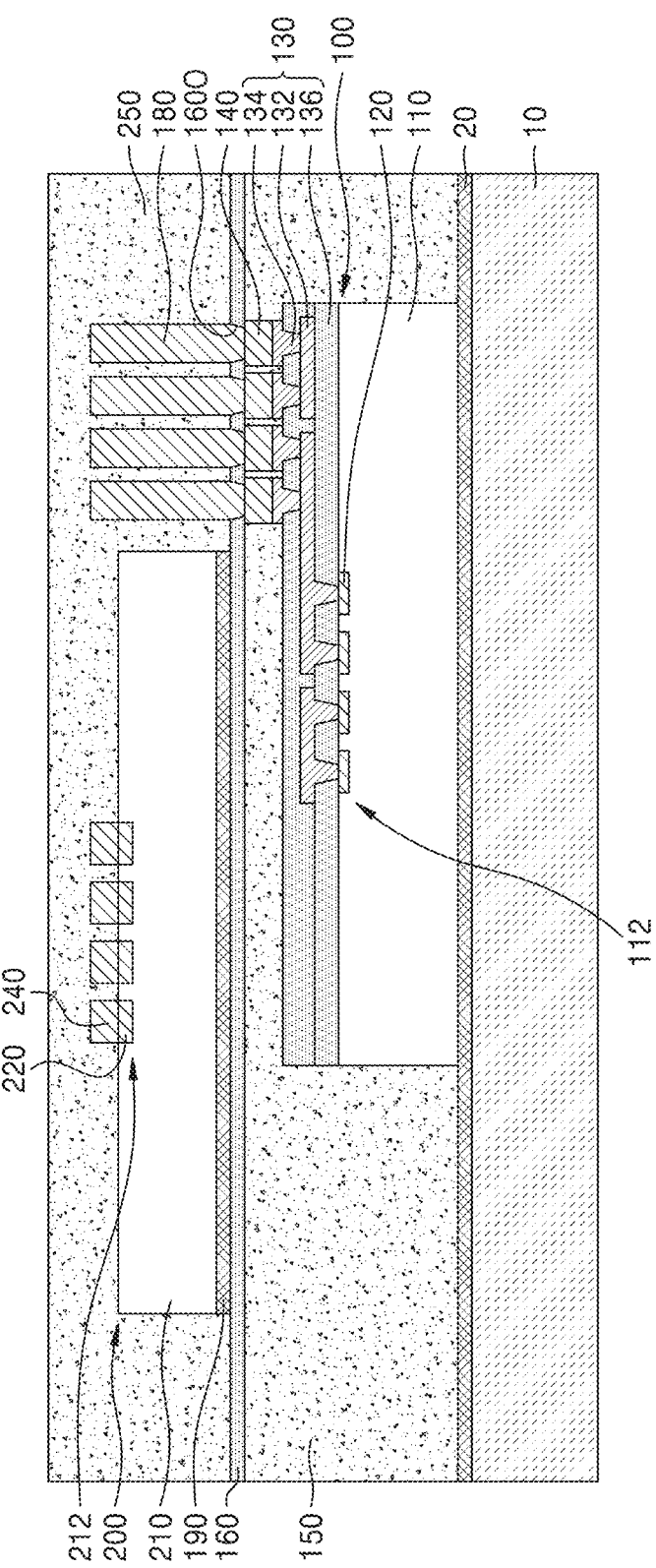

Referring to FIG. 2G, the lower molding layer 250 surrounding the lower semiconductor chip 200, the plurality of lower connection bumps 240, and the plurality of connection posts 180 are formed on the cover insulating layer 160 to which the lower semiconductor chip 200 is attached. In some example embodiments, the lower molding layer 250 may be formed with a sufficient thickness to cover the upper surfaces of the plurality of lower connection bumps 240 and the upper surfaces of the plurality of connection posts 180.

Figure 2H:
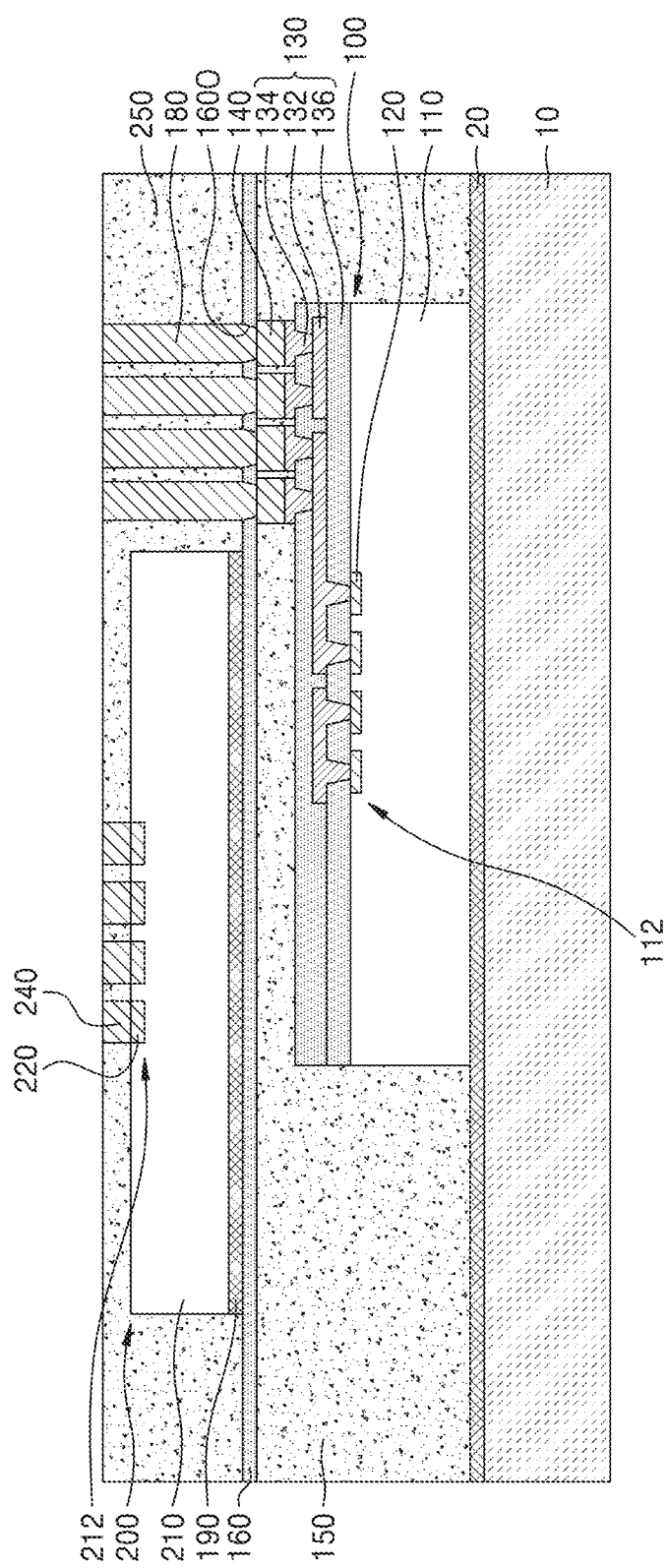

Referring to FIGS. 2G and 2H, an upper portion of the lower molding layer 250 shown in FIG. 2G is removed to expose the upper surfaces of the plurality of lower connection bumps 240 and the upper surfaces of the plurality of connection posts 180. For example, the upper portion of the lower molding layer 250 may be removed by performing a grinding process so that the upper surfaces of the plurality of lower connection bumps 240 and the upper surfaces of the plurality of connection posts 180 are exposed. The upper surfaces of the plurality of lower connection bumps 240, the upper surfaces of the plurality of connection posts 180, and an upper surface of the lower molding layer 250 of which the upper portion has been removed may be coplanar with each other.

In some example embodiments, when the upper surfaces of the plurality of connection posts 180 are located at a slightly higher vertical level than the upper surfaces of the plurality of lower connection bumps 240 in FIG. 2G, in a grinding process of removing the upper portion of the lower molding layer 250, a portion of the plurality of connection posts 180 that is located at the higher vertical level than the upper surfaces of the plurality of lower connection bumps 240 may be removed together.

Referring to FIG. 21, the package redistribution layer 300 including the plurality of package redistribution line patterns 320, the plurality of package redistribution vias 340, and the package redistribution insulating layer 360 is formed on the lower molding layer 250 through which the upper surfaces of the plurality of lower connection bumps 240 and the upper surfaces of the plurality of connection posts 180 are exposed. In some example embodiments, the package redistribution layer 300 may include a plurality of package redistribution insulating layers 360 stacked. For example, the package redistribution layer 300 may be formed by forming the package redistribution insulating layer 360 and then repeating a process of forming a package redistribution via 340 that passes through the package redistribution insulating layer 360, and forming a package redistribution line pattern 320 on the upper surface of the package redistribution insulating layer 360 to be integrated with the package redistribution via 340. The plurality of package redistribution vias 340 may have a tapered shape where a horizontal width thereof gradually increases from a lower side (e.g., a bottom surface) to an upper side (e.g., a top surface) thereof.

In some example embodiments, package redistribution vias 340 on the lower surface of the package redistribution layer 300 among the plurality of package redistribution vias 340 may be in contact with and electrically connected to the plurality of lower connection bumps 240 and the plurality of connection posts 180, respectively. In some other example embodiments, the plurality of package redistribution line patterns 320 may be formed so that some of the plurality of package redistribution line patterns 320 are on the lower surface of the package redistribution layer 300, and the package redistribution line patterns 320 on the lower surface of the package redistribution layer 300 among the plurality of package redistribution line patterns 320 may be in contact with and electrically connected to the plurality of lower connection bumps 240 and the plurality of connection posts 180, respectively. Package redistribution line patterns 320 on the upper surface of the package redistribution layer 300 among the plurality of package redistribution line patterns 320 may be referred as package lower surface pads.

Thereafter, as shown in FIG. 1, the semiconductor package 1 may be formed by attaching the plurality of package connection terminals 500 to the package lower surface pads, removing the support substrate 10 to which the release film 20 is attached from the upper molding layer 150 and the upper semiconductor chip 100, and then turning the resultant structure upside down.

As shown in FIGS. 2A to 2I, the semiconductor package 1 according to the present example embodiment of the inventive concepts may be formed by first forming the upper semiconductor chip 100 and the upper molding layer 150, then forming the cover insulating layer 160 and the connection posts 180, then forming the lower semiconductor chip 200, the lower molding layer 250, and the package redistribution layer 300, finally removing the support substrate 10 to which the release film 20 is attached from the upper molding layer 150 and the upper semiconductor chip 100, and then turning the result upside down. Therefore, the portion of the upper semiconductor chip 100 that overlaps the lower semiconductor chip 200 in the vertical direction in the semiconductor package 1 and is overhung above the lower semiconductor chip 200, may be fixed by the upper molding layer 150 so that structural deformation such as bending may not occur.

Figure 3A:
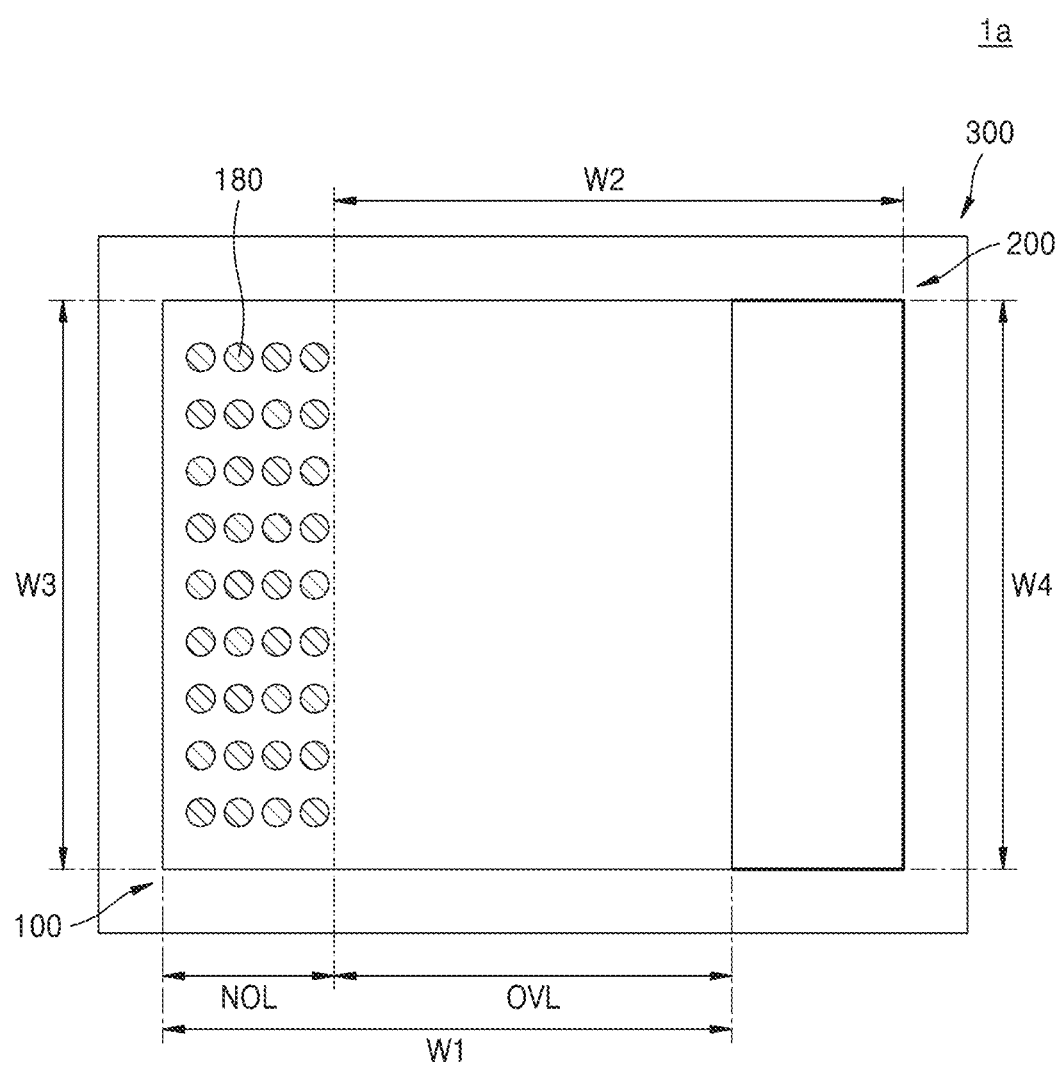
FIGS. 3A and 3B are top views of semiconductor packages according to some example embodiments of the inventive concepts.
Figure 3B:
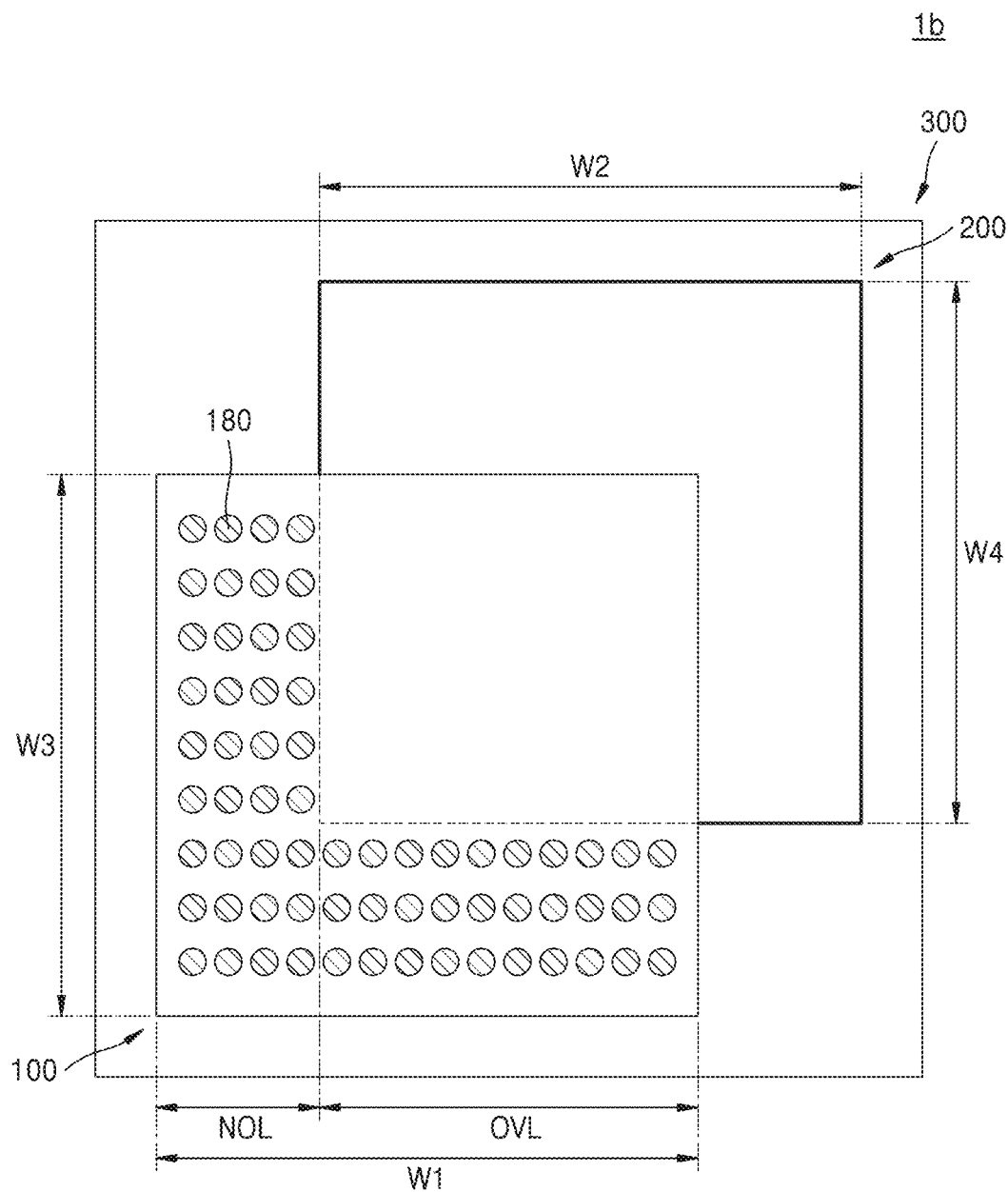

FIGS. 3A and 3B are top views of semiconductor packages 1a and 1b according to some example embodiments of the inventive concepts. For example, the semiconductor package 1a shown in FIG. 3A and the semiconductor package 1b shown in FIG. 3B may be top views of components included in the semiconductor package 1 shown in FIG. 1, and the description made with reference to FIG. 1 may be omitted in a description to be made with reference to FIGS. 3A and 3B.

Referring to FIG. 3A, the semiconductor package 1a includes the lower semiconductor chip 200 above the package redistribution layer 300 and includes the upper semiconductor chip 100 above the lower semiconductor chip 200.

The upper semiconductor chip 100 and the lower semiconductor chip 200 may be partially offset in a width direction. The upper semiconductor chip 100 may be above the lower semiconductor chip 200 so that a portion of the upper semiconductor chip 100 overlaps the lower semiconductor chip 200 in the vertical direction, and the other portion of the upper semiconductor chip 100 does not overlap the lower semiconductor chip 200 in the vertical direction.

In some example embodiments, the plurality of connection posts 180 may be arranged along only one edge among the four edges of the lower semiconductor chip 200, while being separated from the lower semiconductor chip 200 in a top view.

The upper semiconductor chip 100 may be electrically connected to the package redistribution layer 300 via the plurality of connection posts 180. The plurality of connection posts 180 may be under the portion of the upper semiconductor chip 100 that does not overlap the lower semiconductor chip 200 in the vertical direction.

The upper semiconductor chip 100 and the lower semiconductor chip 200 may have the first horizontal width W1 and the second horizontal width W2 in one direction, respectively, and have a third horizontal width W3 and a fourth horizontal width W4 in a direction crossing the one direction, respectively. In some example embodiments, the first horizontal width W1 may be the same as or substantially similar to the second horizontal width W2, and the third horizontal width W3 may be the same as or substantially similar to the fourth horizontal width W4.

For example, when the upper semiconductor chip 100 and the lower semiconductor chip 200 are partially offset in the direction of the first horizontal width W1 and the second horizontal width W2, an overlap width OVL of the portion of the upper semiconductor chip 100 that overlaps the lower semiconductor chip 200 may be greater than a non-overlap width NOL of the portion of the upper semiconductor chip 100 that does not overlap the lower semiconductor chip 200. For example, the overlap width OVL may be about 70% to about 90% of the first horizontal width W1, and the non-overlap width NOL may be about 10% to about 30% of the first horizontal width W1

Referring to FIG. 3B, the semiconductor package 1b includes the lower semiconductor chip 200 above the package redistribution layer 300 and includes the upper semiconductor chip 100 above the lower semiconductor chip 200.

The upper semiconductor chip 100 and the lower semiconductor chip 200 may be partially offset in an inclined direction of the width direction (e.g., a diagonal direction). The upper semiconductor chip 100 may be above the lower semiconductor chip 200 so that a portion of the upper semiconductor chip 100 overlaps the lower semiconductor chip 200 in the vertical direction, and the other portion of the upper semiconductor chip 100 does not overlap the lower semiconductor chip 200 in the vertical direction.

The upper semiconductor chip 100 may be electrically connected to the package redistribution layer 300 via the plurality of connection posts 180. The plurality of connection posts 180 may be under the portion of the upper semiconductor chip 100 that does not overlap the lower semiconductor chip 200 in the vertical direction.

In some example embodiments, the plurality of connection posts 180 may be arranged along only two neighboring edges among the four edges of the lower semiconductor chip 200, while being separated from the lower semiconductor chip 200 in a top view.

Figure 4:
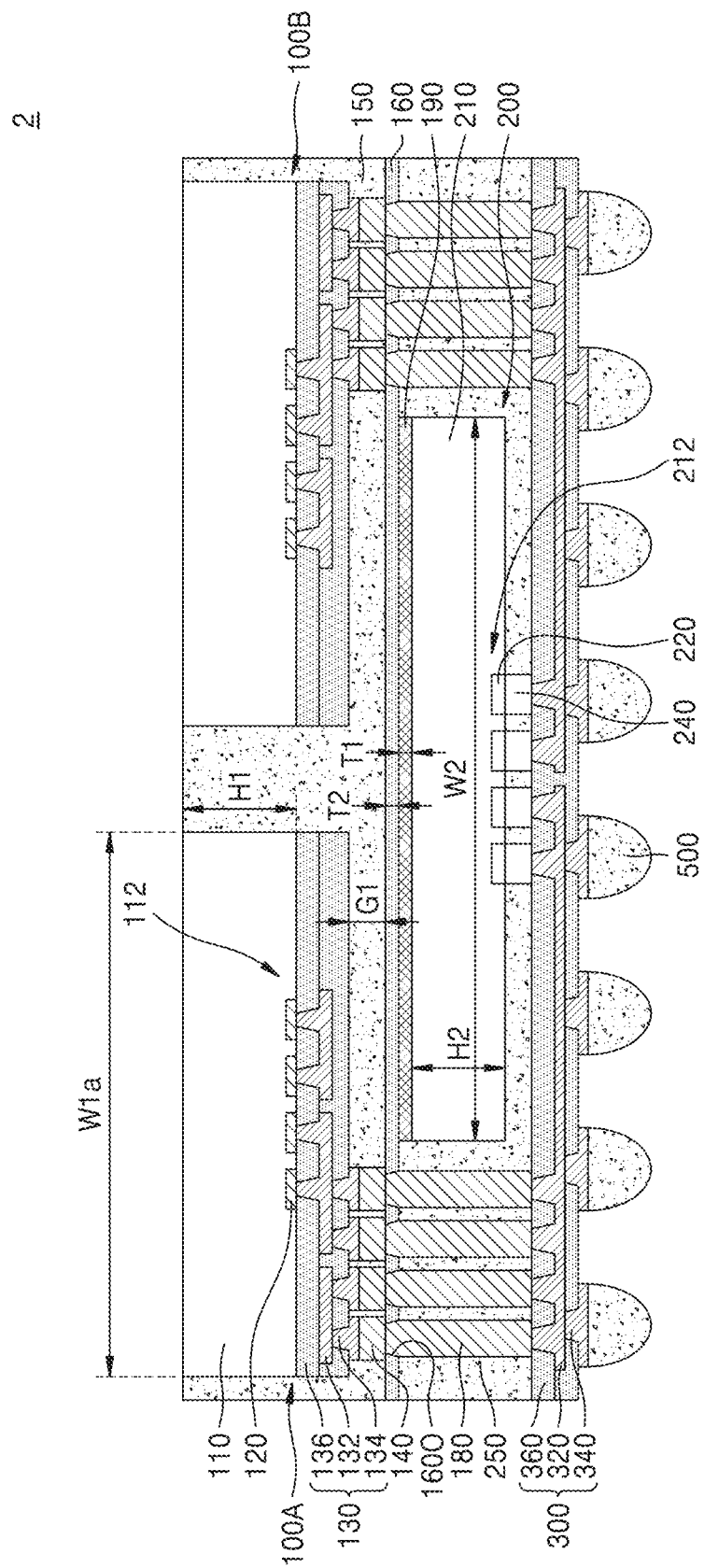
FIG. 4 is a cross-sectional view of a semiconductor package according to an example embodiment of the inventive concepts.

FIG. 4 is a cross-sectional view of a semiconductor package 2 according to an example embodiment of the inventive concepts. The description made with reference to FIGS. 1 to 3B may be omitted in a description to be made with reference to FIG. 4.

Referring to FIG. 4, the semiconductor package 2 may include the package redistribution layer 300, the lower semiconductor chip 200 and the plurality of connection posts 180 attached to the package redistribution layer 300, the lower molding layer 250 surrounding the lower semiconductor chip 200 and the plurality of connection posts 180, at least two upper semiconductor chips 100A and 100B arranged above the lower semiconductor chip 200 and the plurality of connection posts 180 and each having a lower surface to which a corresponding chip redistribution layer 130 is attached, and the upper molding layer 150 surrounding the at least two upper semiconductor chips 100A and 100B and the chip redistribution layer 130. The cover insulating layer 160 may be between the lower molding layer 250 and the upper molding layer 150.

The package redistribution layer 300 may include the plurality of package redistribution line patterns 320, the plurality of package redistribution vias 340, and the package redistribution insulating layer 360. In some example embodiments, a plurality of package redistribution insulating layers 360 may be stacked. The plurality of package redistribution line patterns 320 may be on at least one of the upper surface and the lower surface of the package redistribution insulating layer 360. The plurality of package redistribution vias 340 may be in contact with and connected to some of the plurality of package redistribution line patterns 320, respectively, by passing through the package redistribution insulating layer 360. In some example embodiments, at least some of the plurality of package redistribution line patterns 320 may be integrally formed with some of the plurality of package redistribution vias 340, respectively. For example, a package redistribution line pattern 320 may be integrated with a package redistribution via 340 in contact with an upper surface of the package redistribution line pattern 320.

A plurality of package connection terminals 500 may be respectively attached to the package lower surface pads among the plurality of package redistribution line patterns 320. In some example embodiments, the plurality of package redistribution vias 340 may have a tapered shape where a horizontal width thereof gradually decreases from a lower side (e.g., a bottom surface) to an upper side (e.g., a top surface) thereof. The package redistribution insulating layer 360 may surround the plurality of package redistribution line patterns 320 and the plurality of package redistribution vias 340.

A horizontal width and a horizontal area of the package redistribution layer 300 may be the same as those of the semiconductor package 2, respectively. For example, the horizontal widths and the horizontal areas of the package redistribution layer 300, the lower molding layer 250, the upper molding layer 150, and the cover insulating layer 160 may be the same as or substantially similar to each other, respectively. The package redistribution layer 300, the lower molding layer 250, the upper molding layer 150, and the cover insulating layer 160 may overlap each other in the vertical direction.

The lower semiconductor chip 200 may include the lower semiconductor substrate 210 having the active surface and the inactive surface opposite to each other, the lower semiconductor device 212 formed on the active surface of the lower semiconductor substrate 210, and the plurality of lower chip pads 220 on the lower surface of the lower semiconductor chip 200.

In some example embodiments, the plurality of lower chip pads 220 may be center pads around the center of the lower surface of the lower semiconductor chip 200. The lower semiconductor chip 200 may have a face-down arrangement in which the active surface of the lower semiconductor substrate 210 faces downward. The lower semiconductor chip 200 may be attached to the package redistribution layer 300 so that the active surface of the lower semiconductor substrate 210 faces the package redistribution layer 300.

The lower semiconductor chip 200 may be connected to the package redistribution layer 300 via the plurality of lower connection bumps 240 attached to the plurality of lower chip pads 220. Each of the plurality of lower connection bumps 240 may be in contact with and electrically connected to any one of the plurality of package redistribution vias 340 and the plurality of package redistribution line patterns 320.

The die adhesive film 190 may be attached to the upper surface (e.g., the inactive surface) of the lower semiconductor chip 200. The die adhesive film 190 may completely cover the upper surface of the lower semiconductor chip 200. The die adhesive film 190 may be between the lower semiconductor chip 200 and the cover insulating layer 160. The lower semiconductor chip 200 may be attached to the cover insulating layer 160 by the die adhesive film 190 attached to the inactive surface of the lower semiconductor chip 200.

The lower molding layer 250 may surround the lower semiconductor chip 200, the die adhesive film 190, and the plurality of connection posts 180. The lower molding layer 250 may cover the side surfaces and the lower surface of the lower semiconductor chip 200. The lower molding layer 250 may surround the plurality of lower connection bumps 240 and fill between the lower surface of the lower semiconductor chip 200 and the upper surface of the package redistribution layer 300.

The cover insulating layer 160 may be on the lower molding layer 250. The cover insulating layer 160 may cover the upper surface of the lower molding layer 250 and the upper surface of the die adhesive film 190. The cover insulating layer 160 may have the plurality of connection holes 1600. The plurality of connection holes 1600 may pass through the cover insulating layer 160. In some embodiments, the plurality of connection holes 1600 may have a tapered shape where a horizontal width thereof gradually decreases from a lower side (e.g., a bottom) to an upper side (e.g., a top) thereof.

The plurality of connection posts 180 may be attached to the package redistribution layer 300, while being separated from the lower semiconductor chip 200. The plurality of connection posts 180 may pass through the lower molding layer 250 and the cover insulating layer 160. The plurality of connection posts 180 may fill the plurality of connection holes 1600 of the cover insulating layer 160.

In some example embodiments, the plurality of connection posts 180 may be arranged along only two opposite edges among the four edges of the lower semiconductor chip 200, while being separated from the lower semiconductor chip 200 in a top view. In some other example embodiments, the plurality of connection posts 180 may be arranged along each of the four edges of the lower semiconductor chip 200, while being separated from the lower semiconductor chip 200 in a top view. The portions of the plurality of connection posts 180, which pass through the cover insulating layer 160, (e.g., the portions filling the plurality of connection holes 1600 of the cover insulating layer 160) may have a tapered shape where a horizontal width thereof gradually decreases from a lower side (e.g., a bottom) to an upper side (e.g., a top) thereof.

Any one of the plurality of lower connection bumps 240 and the plurality of connection posts 180 may be in contact with and electrically connected to each of package redistribution vias 340 or package redistribution line patterns 320 on the upper surface of the package redistribution layer 300 among the plurality of package redistribution vias 340 and the plurality of package redistribution line patterns 320.

The upper surfaces of the plurality of connection posts 180 may be coplanar with the upper surface of the cover insulating layer 160. The lower surfaces of the plurality of connection posts 180, the lower surfaces of the plurality of lower connection bumps 240, and the lower surface of the lower molding layer 250 may be coplanar with each other.

The at least two upper semiconductor chips 100A and 100B may be above the cover insulating layer 160. The chip redistribution layer 130 may be attached to a lower surface of each of the at least two upper semiconductor chips 100A and 100B. Each of the at least two upper semiconductor chips 100A and 100B to which the chip redistribution layer 130 is attached may be separated from the cover insulating layer 160 in the vertical direction. That is, the chip redistribution layer 130 may be separated from the cover insulating layer 160 in the vertical direction.

The at least two upper semiconductor chips 100A and 100B may be separated from each other in the horizontal direction, and each of the at least two upper semiconductor chips 100A and 100B may be above the lower semiconductor chip 200 and the plurality of connection posts 180. Each of the at least two upper semiconductor chips 100A and 100B may include the upper semiconductor substrate 110 having the active surface and the inactive surface opposite to each other, the upper semiconductor device 112 formed on the active surface of the upper semiconductor substrate 110, and the plurality of upper chip pads 120. Each of the at least two upper semiconductor chips 100A and 100B is the same as or substantially similar to the upper semiconductor chip 100 shown in FIG. 1, and thus, the same description as made with respect to the upper semiconductor chip 100 is not repeated herein.

Each of the at least two upper semiconductor chips 100A and 100B may have the first height H1 and a first horizontal width W1a, and the lower semiconductor chip 200 may have the second height H2 and the second horizontal width W2. In some example embodiments, the first height H1 may be greater than the second height H2. In some example embodiments, the first height H1 may be about 150 μm to about 300 μm, and the second height H2 may be less than the first height H1 and about 50 μm to about 200 μm. The first horizontal width W1a may be different from the second horizontal width W2. In some embodiments, the first horizontal width W1a may be less than the second horizontal width W2.

The at least two upper semiconductor chips 100A and 100B and the lower semiconductor chip 200 may be different types of semiconductor chips. For example, each of the at least two upper semiconductor chips 100A and 100B may be a DRAM chip, and the lower semiconductor chip 200 may be a logic chip such as a central processing unit (CPU) chip, a graphics processing unit (GPU) chip, or an application processor (AP) chip.

The chip redistribution layer 130 may include the plurality of chip redistribution line patterns 132, the plurality of chip redistribution vias 134, and the chip redistribution insulating layer 136. In some example embodiments, a plurality of chip redistribution insulating layers 136 may be stacked.

The plurality of chip redistribution line patterns 132 may be on at least one of the upper and lower surfaces of the chip redistribution insulating layer 136. The plurality of chip redistribution vias 134 may be in contact with and connected to some of the plurality of chip redistribution line patterns 132, respectively, by passing through the chip redistribution insulating layer 136. In some example embodiments, at least some of the plurality of chip redistribution line patterns 132 may be integrally formed with some of the plurality of chip redistribution vias 134, respectively. For example, a chip redistribution line pattern 132 may be integrated with a chip redistribution via 134 in contact with an upper surface of the chip redistribution line pattern 132. The chip redistribution insulating layer 136 may surround the plurality of chip redistribution line patterns 132 and the plurality of chip redistribution vias 134. In some example embodiments, the plurality of chip redistribution vias 134 may have a tapered shape where a horizontal width thereof gradually decreases from a lower side (e.g., a bottom surface) to an upper side (e.g., a top surface) thereof. The plurality of upper connection bumps 140 may be attached to the chip lower surface pads (e.g., some chip redistribution line patterns among the plurality of chip redistribution line patterns 132).

The horizontal width and the horizontal area of the chip redistribution layer 130 may be the same as those of each of the at least two upper semiconductor chips 100A and 100B, respectively. The chip redistribution layer 130 and each of the at least two upper semiconductor chips 100A and 100B may overlap each other in the vertical direction. Therefore, the horizontal width and the horizontal area of the chip redistribution layer 130 may be less than those of the package redistribution layer 300.

The chip lower surface pads (e.g., some chip redistribution line patterns among the plurality of chip redistribution line patterns 132) and the plurality of upper connection bumps 140 may not overlap the lower semiconductor chip 200 in the vertical direction. In some example embodiments, the chip lower surface pads and the plurality of upper connection bumps 140 may be within the chip redistribution layer 130 and each of the at least two upper semiconductor chips 100A and 100B, along only one edge among four edges of each of the at least two upper semiconductor chips 100A and 100B in a top view. In some other example embodiments, the chip lower surface pads and the plurality of upper connection bumps 140 may be within the chip redistribution layer 130 and each of the at least two upper semiconductor chips 100A and 100B, along only two neighboring edges among the four edges of each of the at least two upper semiconductor chips 100A and 100B in a top view.

The plurality of upper connection bumps 140 may be in contact with and electrically connected to the plurality of connection posts 180. Each of the at least two upper semiconductor chips 100A and 100B may be electrically connected to the package redistribution layer 300 via the plurality of upper chip pads 120, the plurality of chip redistribution line patterns 132 and the plurality of chip redistribution vias 134 included in the chip redistribution layer 130, the plurality of upper connection bumps 140, and the plurality of connection posts 180.

The upper molding layer 150 surrounding the at least two upper semiconductor chips 100A and 100B and the chip redistribution layer 130 may be on the cover insulating layer 160. The upper molding layer 150 may cover side surfaces of each of the at least two upper semiconductor chips 100A and 100B, the upper surface of the chip redistribution layer 130, and the lower surface of the chip redistribution layer 130. The upper molding layer 150 may surround the plurality of upper connection bumps 140 and fill between the lower surface of the chip redistribution layer 130 and the upper surface of the cover insulating layer 160. In some example embodiments, the upper molding layer 150 may not cover the upper surface (e.g., the inactive surface) of each of the at least two upper semiconductor chips 100A and 100B.

The lower surfaces of the plurality of upper connection bumps 140 may be coplanar with the lower surface of the upper molding layer 150. The upper surface of each of the at least two upper semiconductor chips 100A and 100B may be coplanar with the upper surface of the upper molding layer 150.

The plurality of upper connection bumps 140 may not be arranged at a portion where each of the at least two upper semiconductor chips 100A and 100B and the lower semiconductor chip 200 overlap in the vertical direction. That is, the plurality of upper connection bumps 140 may be arranged to overlap a portion of each of the at least two upper semiconductor chips 100A and 100B that does not overlap the lower semiconductor chip 200 in the vertical direction.

At the portion where each of the at least two upper semiconductor chips 100A and 100B and the lower semiconductor chip 200 overlap in the vertical direction, only a portion of the upper molding layer 150 may be between the cover insulating layer 160 and the chip redistribution layer 130. That is, at the portion where each of the at least two upper semiconductor chips 100A and 100B and the lower semiconductor chip 200 overlap in the vertical direction, the chip redistribution layer 130, the upper molding layer 150, the cover insulating layer 160, and the die adhesive film 190 may be interposed, and the plurality of upper connection bumps 140 may not be interposed.

The side walls of the upper molding layer 150, the cover insulating layer 160, the lower molding layer 250, and the package redistribution layer 300 may be aligned in the vertical direction. Corresponding side walls of the upper molding layer 150, the cover insulating layer 160, the lower molding layer 250, and the package redistribution layer 300 may be coplanar.

Each of the at least two upper semiconductor chips 100A and 100B and the lower semiconductor chip 200 may be electrically connected to each other or electrically connected to the plurality of package connection terminals 500, via the plurality of package redistribution line patterns 320 and the plurality of package redistribution vias 340 included in the package redistribution layer 300.

Figure 5A:
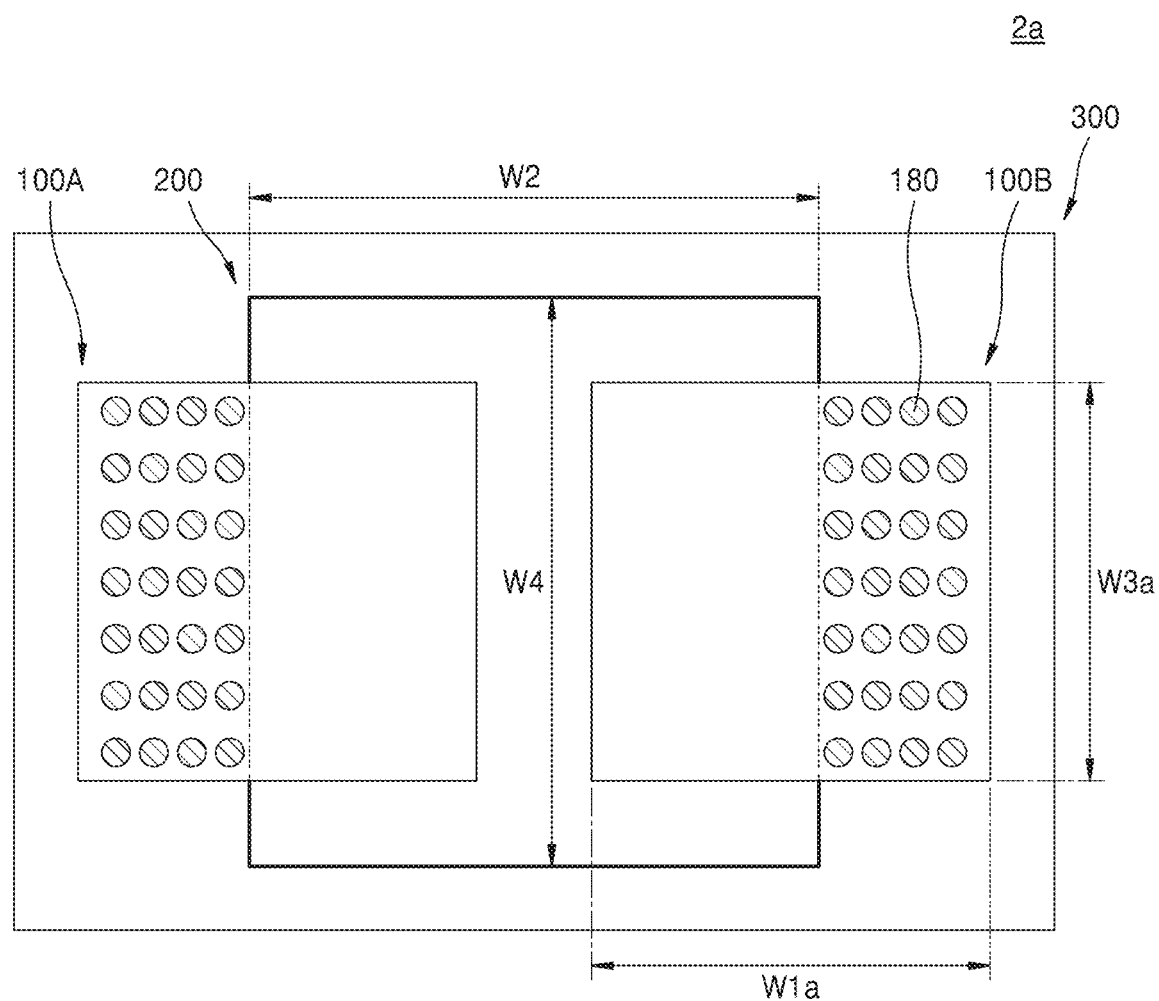
FIGS. 5A and 5B are top views of semiconductor packages according to some example embodiments of the inventive concepts.
Figure 5B:
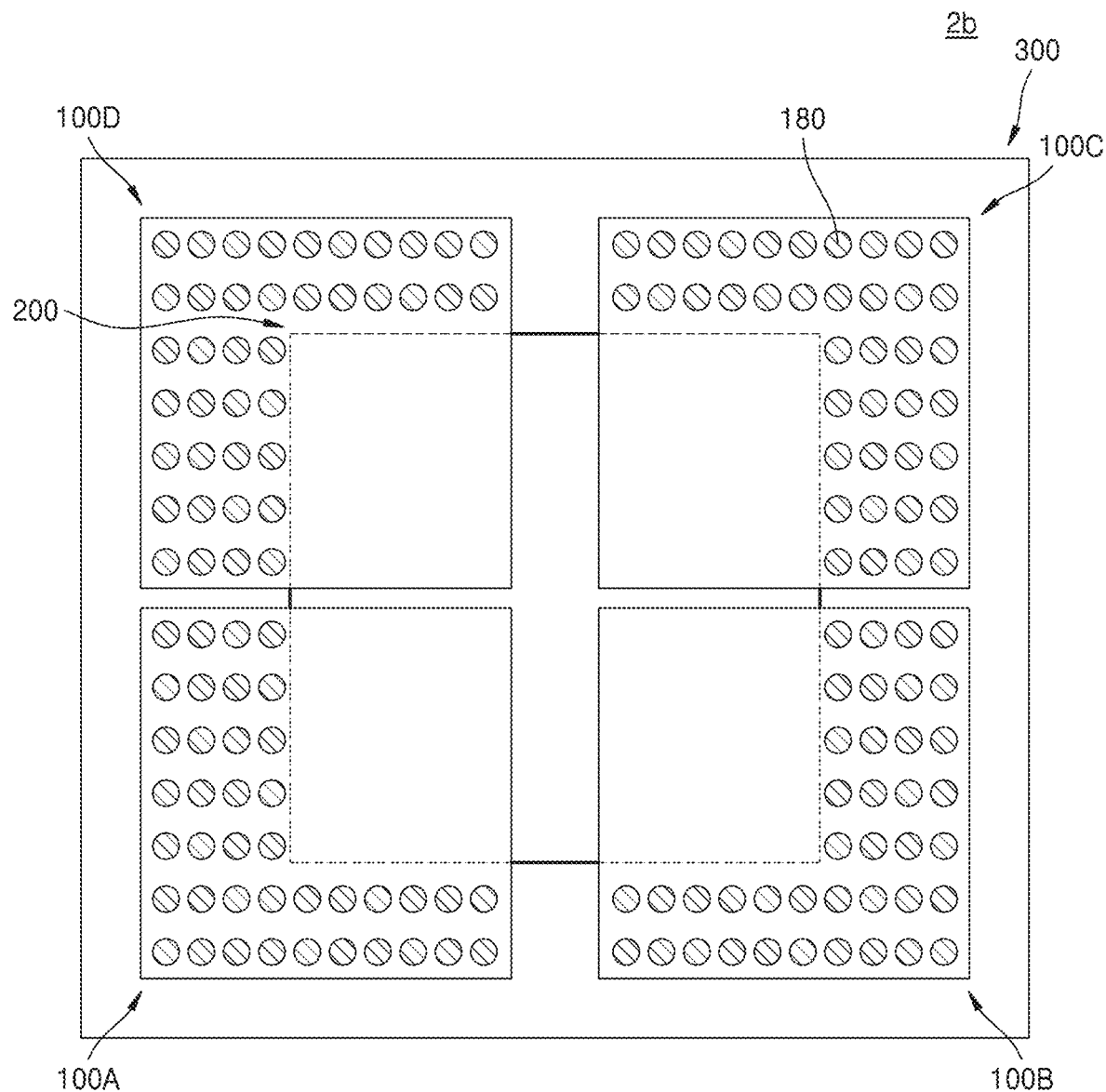

FIGS. 5A and 5B are top views of the semiconductor packages 2a and 2b according to some example embodiments of the inventive concepts. For example, the semiconductor package 2a shown in FIG. 5A and the semiconductor package 2b shown in FIG. 5B may be top views of components included in the semiconductor package 2 shown in FIG. 4, and the description made with reference to FIG. 4 may be omitted in a description to be made with reference to FIGS. 5A and 5B.

Referring to FIG. 5A, the semiconductor package 2a includes the lower semiconductor chip 200 above the package redistribution layer 300 and includes a first upper semiconductor chip 100A and a second upper semiconductor chip 100B above the lower semiconductor chip 200.

Each of the first upper semiconductor chip 100A and the second upper semiconductor chip 100B may be partially offset with respect to the lower semiconductor chip 200 in a width direction. Each of the first upper semiconductor chip 100A and the second upper semiconductor chip 100B may be above the lower semiconductor chip 200 so that a portion of each of the first upper semiconductor chip 100A and the second upper semiconductor chip 100B overlaps the lower semiconductor chip 200 in the vertical direction, and the other portion of each of the first upper semiconductor chip 100A and the second upper semiconductor chip 100B does not overlap the lower semiconductor chip 200 in the vertical direction. The first upper semiconductor chip 100A and the second upper semiconductor chip 100B may be arranged along two opposite edges among the four edges of the lower semiconductor chip 200, respectively. The first upper semiconductor chip 100A may overlap one edge among the four edges of the lower semiconductor chip 200 in the vertical direction, and the second upper semiconductor chip 100B may overlap, in the vertical direction, another edge opposite to the one edge of the lower semiconductor chip 200 that the first upper semiconductor chip 100A overlaps in the vertical direction.

In some example embodiments, the plurality of connection posts 180 may be arranged along only two opposite edges, among the four edges of the lower semiconductor chip 200, which overlap the first upper semiconductor chip 100A and the second upper semiconductor chip 100B in the vertical direction, respectively, while being separated from the lower semiconductor chip 200 in a top view.

Each of the first upper semiconductor chip 100A and the second upper semiconductor chip 100B may be electrically connected to the package redistribution layer 300 via the plurality of connection posts 180. A first set of connection posts 180 among the plurality of connection posts 180, which are arranged along one of the four edges of the lower semiconductor chip 200, may be electrically connected to the first upper semiconductor chip 100A, and a second set of connection posts 180 arranged along the other one edge may be electrically connected to the second upper semiconductor chip 100B. The plurality of connection posts 180 may be under the portions of the first upper semiconductor chip 100A and the second upper semiconductor chip 100B that do not overlap the lower semiconductor chip 200 in the vertical direction.

In one direction, each of the first upper semiconductor chip 100A and the second upper semiconductor chip 100B may have the first horizontal width W1a, and the lower semiconductor chip 200 may have the second horizontal width W2, and in a direction crossing the one direction, each of the first upper semiconductor chip 100A and the second upper semiconductor chip 100B may have a third horizontal width W3a, and the lower semiconductor chip 200 may have the fourth horizontal width W4. In some example embodiments, the first horizontal width W1a may be less than the second horizontal width W2, and the third horizontal width W3a may be less than the fourth horizontal width W4.

In some example embodiments, each of the first upper semiconductor chip 100A and the second upper semiconductor chip 100B may overlap the lower semiconductor chip 200 by about 70% to about 90% in the vertical direction and may not overlap the lower semiconductor chip 200 by about 10% to about 30% in the vertical direction.

Referring to FIG. 5B, the semiconductor package 2b includes the lower semiconductor chip 200 above the package redistribution layer 300 and includes the first upper semiconductor chip 100A, the second upper semiconductor chip 100B, a third upper semiconductor chip 100C, and a fourth upper semiconductor chip 100D above the lower semiconductor chip 200.

Each of the first upper semiconductor chip 100A, the second upper semiconductor chip 100B, the third upper semiconductor chip 100C, and the fourth upper semiconductor chip 100D may be partially offset with respect to the lower semiconductor chip 200 in an inclined direction with respect to the width direction (e.g., a diagonal direction). Each of the first upper semiconductor chip 100A, the second upper semiconductor chip 100B, the third upper semiconductor chip 100C, and the fourth upper semiconductor chip 100D may be above the lower semiconductor chip 200 so that a portion of each of the first upper semiconductor chip 100A, the second upper semiconductor chip 100B, the third upper semiconductor chip 100C, and the fourth upper semiconductor chip 100D overlap the lower semiconductor chip 200 in the vertical direction, and the other portion of each of the first upper semiconductor chip 100A, the second upper semiconductor chip 100B, the third upper semiconductor chip 100C, and the fourth upper semiconductor chip 100D does not overlap the lower semiconductor chip 200 in the vertical direction.

For example, the first upper semiconductor chip 100A, the second upper semiconductor chip 100B, the third upper semiconductor chip 100C, and the fourth upper semiconductor chip 100D may be above the lower semiconductor chip 200, while being separated from each other so that the first upper semiconductor chip 100A, the second upper semiconductor chip 100B, the third upper semiconductor chip 100C, and the fourth upper semiconductor chip 100D respectively overlap the four edges of the lower semiconductor chip 200 in the vertical direction.

In some example embodiments, the plurality of connection posts 180 may be arranged along the four edges of the lower semiconductor chip 200 in the vertical direction, while being separated from the lower semiconductor chip 200 in a top view.

Each of the first upper semiconductor chip 100A, the second upper semiconductor chip 100B, the third upper semiconductor chip 100C, and the fourth upper semiconductor chip 100D may be electrically connected to the package redistribution layer 300 via different sets of connection posts 180, among the plurality of connection posts 180, respectively. The different sets of connection posts 180 may be under the portions of the first upper semiconductor chip 100A, the second upper semiconductor chip 100B, the third upper semiconductor chip 100C, and the fourth upper semiconductor chip 100D that do not overlap the lower semiconductor chip 200 in the vertical direction, and the first upper semiconductor chip 100A, the second upper semiconductor chip 100B, the third upper semiconductor chip 100C, and the fourth upper semiconductor chip 100D may be electrically connected to the package redistribution layer 300 via the different sets of connection posts 180 that are arranged under the first upper semiconductor chip 100A, the second upper semiconductor chip 100B, the third upper semiconductor chip 100C, and the fourth upper semiconductor chip 100D, respectively, in the vertical direction.

While the inventive concepts have been particularly shown and described with reference to some example embodiments thereof, it will be understood that various changes in form and details may be made therein without departing from the spirit and scope of the following claims.

What is claimed is:

1. A semiconductor package comprising:
   a package redistribution layer;
   a cover insulating layer on the package redistribution layer;
   a lower semiconductor chip arranged between the package redistribution layer and the cover insulating layer and electrically connected to the package redistribution layer;
   a lower molding layer surrounding the lower semiconductor chip and filling between the package redistribution layer and the cover insulating layer;
   a plurality of connection posts separated from the lower semiconductor chip in a horizontal direction and electrically connected to the package redistribution layer by passing through the cover insulating layer and the lower molding layer;
   an upper semiconductor chip arranged above the cover insulating layer, the upper semiconductor chip including a first portion and a second portion, the first portion overlapping a portion of the lower semiconductor chip in a vertical direction, the second portion overlapping the plurality of connection posts in the vertical direction and electrically connected to the plurality of connection posts;
   a chip redistribution layer attached to a lower surface of the upper semiconductor chip;
   a plurality of upper connection bumps between a lower surface of the chip redistribution layer and upper surfaces of the plurality of connection posts, the plurality of upper connection bumps electrically connecting the upper semiconductor chip to the plurality of connection posts; and
   an upper molding layer filling between the upper semiconductor chip and the cover insulating layer and surrounding the upper semiconductor chip such that the upper molding layer fills a gap between the chip redistribution layer and the cover insulating layer on the lower semiconductor chip, a first height of the gap being greater than a second height of each of the plurality of upper connection bumps.

2. The semiconductor package of claim 1, wherein the upper semiconductor chip has a third height, and the lower semiconductor chip has a fourth height that is less than the third height.

3. The semiconductor package of claim 2, wherein the upper semiconductor chip and the lower semiconductor chip have a same horizontal width and a horizontal area.

4. The semiconductor package of claim 1, wherein the upper semiconductor chip and the lower semiconductor chip are partially offset from each other in a width direction thereof.

5. The semiconductor package of claim 1, wherein the upper semiconductor chip and the lower semiconductor chip are partially offset from each other in a diagonal direction thereof.

6. The semiconductor package of claim 1, wherein the lower semiconductor chip is electrically connected to the package redistribution layer via a plurality of lower connection bumps attached to a lower surface of the lower semiconductor chip.

7. The semiconductor package of claim 6, wherein lower surfaces of the plurality of lower connection bumps, lower surfaces of the plurality of connection posts, and a lower surface of the lower molding layer are coplanar.

8. The semiconductor package of claim 1, wherein lower surfaces of the upper connection bumps are coplanar with a lower surface of the upper molding layer.

9. The semiconductor package of claim 1, wherein the lower semiconductor chip has a die adhesive film attached to an upper surface thereof and a lower surface of the cover insulating layer.

10. A semiconductor package comprising:
a package redistribution layer;
a cover insulating layer on the package redistribution layer;
a lower semiconductor chip arranged between the package redistribution layer and the cover insulating layer, electrically connected to the package redistribution layer via a plurality of lower connection bumps attached to a lower surface of the lower semiconductor chip, and attached to a lower surface of the cover insulating layer with a die adhesive film therebetween, the die adhesive film being attached to an upper surface of the lower semiconductor chip;
a lower molding layer surrounding the lower semiconductor chip and the plurality of lower connection bumps and filling between the package redistribution layer and the cover insulating layer;
a plurality of connection posts adjacent to the lower semiconductor chip, separated from the lower semiconductor chip in a horizontal direction, and electrically connected to the package redistribution layer by passing through the cover insulating layer and the lower molding layer;
an upper semiconductor chip arranged above the cover insulating layer to overlap the plurality of connection posts in a vertical direction by a portion of the upper semiconductor chip that is offset with respect to the lower semiconductor chip in the horizontal direction, the upper semiconductor chip having a same horizontal width and a horizontal area as the lower semiconductor chip;
a chip redistribution layer attached to a lower surface of the upper semiconductor chip;
a plurality of upper connection bumps between a lower surface of the chip redistribution layer and upper surfaces of the plurality of connection posts, the plurality of upper connection bumps electrically connecting the upper semiconductor chip to the plurality of connection posts; and
an upper molding layer filling between the lower surface of the upper semiconductor chip and an upper surface of the cover insulating layer and surrounding the upper semiconductor chip and the plurality of upper connection bumps such that the upper molding layer fills a gap between the chip redistribution layer and the cover insulating layer on the lower semiconductor chip, a first height of the gap being greater than a second height of each of the plurality of upper connection bumps.

11. The semiconductor package of claim 10, wherein side walls of the upper molding layer, the cover insulating layer, the lower molding layer, and the package redistribution layer are aligned in the vertical direction.

12. The semiconductor package of claim 10, wherein a horizontal width and a horizontal area of the chip redistribution layer are same as a horizontal width and a horizontal area of the upper semiconductor chip, respectively, and the chip redistribution layer and the upper semiconductor chip overlap each other in the vertical direction.

13. The semiconductor package of claim 10, wherein the upper semiconductor chip has a third height, the lower semiconductor chip has a fourth height that is less than the third height, and the upper semiconductor chip and the lower semiconductor chip are a same type of semiconductor chips.

14. The semiconductor package of claim 10, wherein lower surfaces of the plurality of lower connection bumps, lower surfaces of the plurality of connection posts, and a lower surface of the lower molding layer are coplanar, and upper surfaces of the plurality of connection posts is coplanar with the upper surface of the cover insulating layer.

15. The semiconductor package of claim 10, wherein lower surfaces of the plurality of upper connection bumps are coplanar with a lower surface of the upper molding layer, and an upper surface of the upper semiconductor chip is coplanar with an upper surface of the upper molding layer.

16. The semiconductor package of claim 10, wherein, at a portion where the upper semiconductor chip and the lower semiconductor chip overlap in the vertical direction, only a portion of the upper molding layer is between the cover insulating layer and the chip redistribution layer.

17. A semiconductor package comprising:
a package redistribution layer;
a cover insulating layer on the package redistribution layer;
a lower semiconductor chip arranged between the package redistribution layer and the cover insulating layer, electrically connected to the package redistribution layer via a plurality of lower connection bumps attached to a lower surface of the lower semiconductor chip, attached to a lower surface of the cover insulating layer with a die adhesive film therebetween, and having a first height, the die adhesive film being attached to an upper surface of the lower semiconductor chip;
a lower molding layer surrounding the lower semiconductor chip and the plurality of lower connection bumps and filling between the package redistribution layer and the cover insulating layer;
a plurality of connection posts adjacent to the lower semiconductor chip, separated from the lower semiconductor chip in a horizontal direction, and electrically connected to the package redistribution layer by passing through the cover insulating layer and the lower molding layer;
an upper semiconductor chip arranged above the cover insulating layer to overlap the plurality of connection posts in a vertical direction by a portion of the upper semiconductor chip that is offset with respect to the lower semiconductor chip in the horizontal direction, the upper semiconductor chip having a same horizontal width and a horizontal area as the lower semiconductor chip, and having a second height that is greater than the first height;
a chip redistribution layer attached to a lower surface of the upper semiconductor chip and overlapping the upper semiconductor chip in the vertical direction;
a plurality of upper connection bumps between a lower surface of the chip redistribution layer and upper surfaces of the plurality of connection posts and electrically connecting the upper semiconductor chip to the plurality of connection posts; and an upper molding layer filling between the lower surface of the upper semiconductor chip and an upper surface of the cover insulating layer, surrounding the upper semiconductor chip and the plurality of upper connection bumps, and separated from the lower molding layer, the upper molding layer filling a gap between the chip redistribution layer and the cover insulating layer on the lower semiconductor chip, a third height of the gap being greater than a fourth height of each of the plurality of upper connection bumps.

18. The semiconductor package of claim 17, wherein the gap is in a range between 20 μm and 50 μm.

19. The semiconductor package of claim 17, wherein the second height is greater than the first height by 50 μm to 150 μm.

* * * * *